United States Patent
Takahashi et al.

(10) Patent No.: US 8,178,947 B2
(45) Date of Patent: May 15, 2012

(54) SEMICONDUCTOR DEVICE

(75) Inventors: Tetsuo Takahashi, Chiyoda-ku (JP);
Yoshifumi Tomomatsu, Chiyoda-ku (JP)

(73) Assignee: Mitsubishi Electric Corporation (JP)

( * ) Notice: Subject to any disclaimer, the term of this patent is extended or adjusted under 35 U.S.C. 154(b) by 694 days.

(21) Appl. No.: 12/243,335

(22) Filed: Oct. 1, 2008

(65) Prior Publication Data
US 2009/0283797 A1 Nov. 19, 2009

(30) Foreign Application Priority Data
May 13, 2008 (JP) ................... 2008-126170

(51) Int. Cl.
*H01L 29/76* (2006.01)

(52) U.S. Cl. ........ 257/565; 257/133; 257/139; 257/329; 257/330; 257/331; 257/579; 257/E29.171; 257/E29.198; 257/E29.027; 257/E29.201; 257/E21.384; 257/E21.383; 438/138; 438/589

(58) Field of Classification Search ............ 257/565, 257/139, 329, 330, 331, 579, E29.171, E29.198, 257/E21.027, E29.04, E29.201, E21.384, 257/E21.383
See application file for complete search history.

(56) References Cited

U.S. PATENT DOCUMENTS

| | | | |
|---|---|---|---|
| 6,392,272 B1 * | 5/2002 | Hasegawa | 257/329 |
| 6,768,168 B1 * | 7/2004 | Takahashi | 257/330 |
| 6,781,200 B2 * | 8/2004 | Ishimura et al. | 257/330 |
| 6,891,224 B2 | 5/2005 | Ogura et al. | |
| 7,211,837 B2 * | 5/2007 | Tomomatsu et al. | 257/156 |
| 7,701,003 B2 * | 4/2010 | Minato et al. | 257/330 |
| 7,982,265 B2 * | 7/2011 | Challa et al. | 257/341 |
| 2002/0179976 A1 | 12/2002 | Takahashi | |
| 2003/0042537 A1 | 3/2003 | Nakamura et al. | |
| 2003/0141542 A1 * | 7/2003 | Ishimura et al. | 257/330 |
| 2004/0178441 A1 | 9/2004 | Yanagisawa | |
| 2005/0032280 A1 * | 2/2005 | Yanagisawa | 438/138 |
| 2005/0167742 A1 * | 8/2005 | Challa et al. | 257/328 |
| 2005/0263853 A1 * | 12/2005 | Tomomatsu et al. | 257/565 |
| 2005/0280029 A1 * | 12/2005 | Nakamura et al. | 257/192 |
| 2006/0138535 A1 * | 6/2006 | Ono et al. | 257/330 |
| 2006/0214221 A1 * | 9/2006 | Challa et al. | 257/328 |
| 2008/0197407 A1 * | 8/2008 | Challa et al. | 257/330 |
| 2008/0224207 A1 * | 9/2008 | Sakamoto et al. | 257/331 |

(Continued)

FOREIGN PATENT DOCUMENTS

DE  101 61 129 A1  12/2002

(Continued)

OTHER PUBLICATIONS

Office Action issued Sep. 14, 2010, in Korea Patent Application No. 10-2009-0121664 (with English translation).

(Continued)

*Primary Examiner* — Victor A Mandala
*Assistant Examiner* — William Harriston
(74) *Attorney, Agent, or Firm* — Studebaker & Brackett PC; Donald R. Studebaker; John F. Guay

(57) ABSTRACT

There is provided a semiconductor device in which an amount of fluctuations in output capacitance and feedback capacitance is reduced. In a trench-type insulated gate semiconductor device, a width of a portion of an electric charge storage layer in a direction along which a gate electrode and a dummy gate are aligned is set to be at most 1.4 μm.

29 Claims, 15 Drawing Sheets

U.S. PATENT DOCUMENTS

| | | | |
|---|---|---|---|
| 2008/0308839 A1* | 12/2008 | Okada | 257/133 |
| 2008/0315249 A1* | 12/2008 | Minato et al. | 257/139 |
| 2009/0020852 A1* | 1/2009 | Harada | 257/579 |
| 2010/0167516 A1* | 7/2010 | Minato et al. | 438/589 |
| 2010/0308401 A1* | 12/2010 | Narazaki | 257/330 |

FOREIGN PATENT DOCUMENTS

| | | |
|---|---|---|
| JP | 8-316479 | 11/1996 |
| JP | 2001-308327 | 11/2001 |
| JP | 2002-16252 | 1/2002 |
| JP | 2005-353456 | 12/2002 |
| JP | 2003-188382 | 7/2003 |
| JP | 2004-22941 | 1/2004 |
| JP | 2004-153112 | 5/2004 |
| JP | 2004-273921 | 9/2004 |
| JP | 2005-32941 | 2/2005 |
| JP | 2007-13224 | 1/2007 |
| JP | 2008-21918 | 1/2008 |
| KR | 2002-0090837 | 12/2002 |
| WO | WO 02/058160 A1 | 7/2002 |

OTHER PUBLICATIONS

Office Action issued Oct. 19, 2010, in Japan Patent Application No. 2008-126170 (with English-language Translation).

* cited by examiner

WIDTH OF ELECTRIC CHARGE STORAGE LAYER (um) (W)

SEMICONDUCTOR DEVICE

BACKGROUND OF THE INVENTION

1. Field of the Invention

The present invention relates to a semiconductor device.

2. Description of the Background Art

Conventionally, various types of semiconductor devices, an example of which is an IGBT (Insulated Gate Bipolar Transistor), have been proposed.

For example, an insulated gate-type semiconductor device disclosed in Japanese Patent Laying-Open No. 2002-016252 includes a trench gate and a dummy gate disposed on each of opposite sides of the trench gate. Further, the semiconductor device includes a P-type base layer formed between the trench gate and each of the dummy gates, and an emitter electrode formed at a surface of the P-type base layer and at a side surface of the trench gate.

Further, a contact portion is provided on the opposite sides of the trench gate, so that the emitter electrode is brought into ohmic contact with the P-type base layer and an N-type source layer.

It is thereby possible to reduce gate capacitance without decreasing channel density, and alleviate concentration of an avalanche current as well.

Further, an insulated gate-type semiconductor device described in Japanese Patent Laying-Open No. 2001-308327 includes a silicon substrate, an N-type drift layer formed on the silicon substrate and having low impurity concentration, a P-type base region formed on the N-type drift layer and having impurity concentration higher than the impurity concentration of the N-type drift layer, and an $n^+$ source region formed on the P-type base region.

Further, the insulated gate-type semiconductor device includes a groove that penetrates the P-type base region from a surface of the $n^+$ source region and reaches the N-type drift layer, a gate oxide film arranged inside the groove, a gate electrode arranged in the groove with the gate oxide film interposed therebetween, an emitter electrode arranged at surfaces of the P-type base region and the $n^+$ source region, and a collector electrode arranged at the other surface of the silicon substrate.

In this insulated gate-type semiconductor device, a switching loss is reduced while keeping an on-voltage of the trench-type IGBT as low as an on-voltage of an IEGT (Injection Enhanced Gate Transistor), so that the total loss generated therein is reduced.

A semiconductor device described in Japanese Patent Laying-Open No. 2003-188382 includes an n-type base layer, an emitter layer formed under the n-type base layer, a collector electrode formed under the emitter layer, a p-type base layer formed at a surface located on a side opposite to the collector electrode, and an n-type source layer formed at the p-type base layer.

The n-type source layer and the p-type base layer are connected to an emitter electrode. A first trench and a second trench are formed such that they penetrate the p-type base layer from a surface of the n-type source layer and reach an inner portion of the n-type base layer in a depth direction. A gate electrode is formed in the first trench with a gate insulating film interposed therebetween. An embedded electrode is formed in the second trench with an insulating film interposed therebetween. The embedded electrode and the emitter electrode are electrically connected, so that they are at substantially the same potential.

As such, by maintaining the embedded electrode and the emitter electrode at substantially the same potential, a gate voltage is made stable even under a high current, and a non-uniform current, oscillation, and others are suppressed.

A power semiconductor device described in Japanese Patent Laying-Open No. 2004-153112 and Japanese Patent Laying-Open No. 2007-013224 includes a collector layer of a second conductivity type, a first base layer of a first conductivity type formed on the collector layer, and a plurality of trenches disposed apart from one another in the first base layer at positions apart from the collector layer, such that they serve as partitions between a main cell and a dummy cell.

Further, in the power semiconductor device, a second base layer of a second conductivity type and an emitter layer of a first conductivity type are provided in the main cell, while a buffer layer of a second conductivity type is provided in the dummy cell. In a trench adjacent to the main cell, a gate electrode is disposed with a gate insulating film interposed therebetween. A buffer resistor is inserted between the buffer layer and an emitter electrode.

In the power semiconductor device, switching characteristics are improved, while a low on-voltage is maintained.

An insulated gate-type semiconductor device described in Japanese Patent Laying-Open No. 2005-032941 includes a polysilicon film, a gate electrode formed on the polysilicon film and having a trench gate structure, a floating p region formed on the polysilicon film, an insulating film formed on the floating p region, and an emitter electrode which is formed on the insulating film and to which an emitter potential is applied.

The insulating film formed on the floating p region is made thicker than a gate insulating film of the gate electrode, and made thinner than an interlayer insulating film covering the gate electrode. Thereby, a large condenser is formed between the floating p region and the emitter electrode.

The condenser converts the most part of gate-collector capacitance into collector-emitter capacitance and gate-emitter capacitance, so that gate-collector capacitance is effectively reduced.

A semiconductor device described in Japanese Patent Laying-Open No. 2002-353456 includes a $P^+$ substrate, an $N^+$ buffer layer formed on the $P^+$ substrate, an $N^-$ layer formed on the $N^+$ buffer layer, and first and second groove portions formed such that they penetrate the $N^-$ layer and reach an upper layer portion of the $N^-$ layer.

A prescribed number of second grooves are formed between first grooves. The first groove is adjacent to an $N^+$ emitter region, and has a gate electrode formed therein. The second groove has a polysilicon region formed therein. The second groove differs from the first groove in that an $N^+$ emitter region is not formed in its peripheral region, and that it has no gate electrode formed therein.

A trench-to-trench spacing between the first and second grooves adjacent to each other is set to be a distance within a range where a withstand voltage is not lowered. In addition, an emitter electrode is formed directly on approximately the whole surface of the base region. By connecting the emitter electrode as such, operating characteristics are improved while the semiconductor device is being driven.

An insulated gate-type semiconductor element described in Japanese Patent Laying-Open No. 08-316479 includes an n-type drift layer made of low-concentration impurities and formed on a silicon substrate, a p-type base region formed above the n-type drift layer and having concentration higher than that of the n-type drift layer, an n-type carrier storage layer formed immediately below the p-type base region and having concentration higher than that of the n-type drift layer, and an n-type source region formed in the p-type base region. Further, the insulated gate-type semiconductor device includes a groove that penetrates the p-type base region and the n-type carrier storage layer from a surface of the n-type source region and reaches the n-type drift layer, a gate oxide film arranged inside the groove, a gate electrode disposed in the groove with the gate oxide film interposed therebetween, an emitter electrode formed in the p base region and the n-type source region, and a collector electrode formed at the other surface of the silicon substrate.

This structure is called as a carrier storage type IGBT. The n-type carrier storage layer formed under the p-type base region can significantly reduce an on-voltage, so that trade-off is improved.

In some of the semiconductor devices and the power semiconductor device configured as described above, when a voltage between the collector electrode and the emitter electrode is gradually increased, output capacitance (capacitance between the collector electrode and the emitter electrode) and feedback capacitance (capacitance between the collector electrode and the gate electrode) may be decreased drastically.

If output capacitance and feedback capacitance drastically fluctuate as such, an electromagnetic noise tends to be generated, and hence when such a device is mounted and activated, it causes a problem.

SUMMARY OF THE INVENTION

The present invention has been made in view of the above-described problems. An object of the present invention is to provide a semiconductor device in which an amount of fluctuations in output capacitance and feedback capacitance is reduced.

A semiconductor device according to the present invention includes: a first impurity region of a first conductivity type, formed between a first main surface and a second main surface; a second impurity region of a second conductivity type, formed at the second main surface; a first groove portion formed at the first main surface and reaching the first impurity region; a first electrode formed in the first groove portion with a first insulating film interposed therebetween; a second groove portion formed apart from the first groove portion and reaching the first impurity region from the first main surface; and a second electrode formed in the second groove portion with a second insulating film interposed therebetween. Further, the semiconductor device includes: a gate wiring connected to the first electrode and capable of applying a gate voltage to the first electrode; a third impurity region of the first conductivity type, formed at a position of the first main surface adjacent to the first electrode on a side facing the second electrode; a fourth impurity region of the second conductivity type, formed at the first main surface located between the first electrode and the second electrode, and formed to surround the third impurity region; and a main electrode formed on the first main surface and connected to the third impurity region and the fourth impurity region. Further, the semiconductor device includes: an interlayer insulating film formed on the first electrode and capable of insulating the main electrode and the first electrode from each other; and a fifth impurity region of the first conductivity type, formed between the first and second electrodes and between the fourth impurity region and the first impurity region, and having impurity concentration higher than impurity concentration of the first impurity region. A width of the fifth impurity region in a direction along which the first electrode and the second electrode are aligned is set to be at most 1.4 μm.

In the semiconductor device according to the present invention, even if a collector-emitter voltage is gradually increased, it is possible to suppress fluctuations in output capacitance and feedback capacitance, so that it is possible to suppress generation of electromagnetic noise and others.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
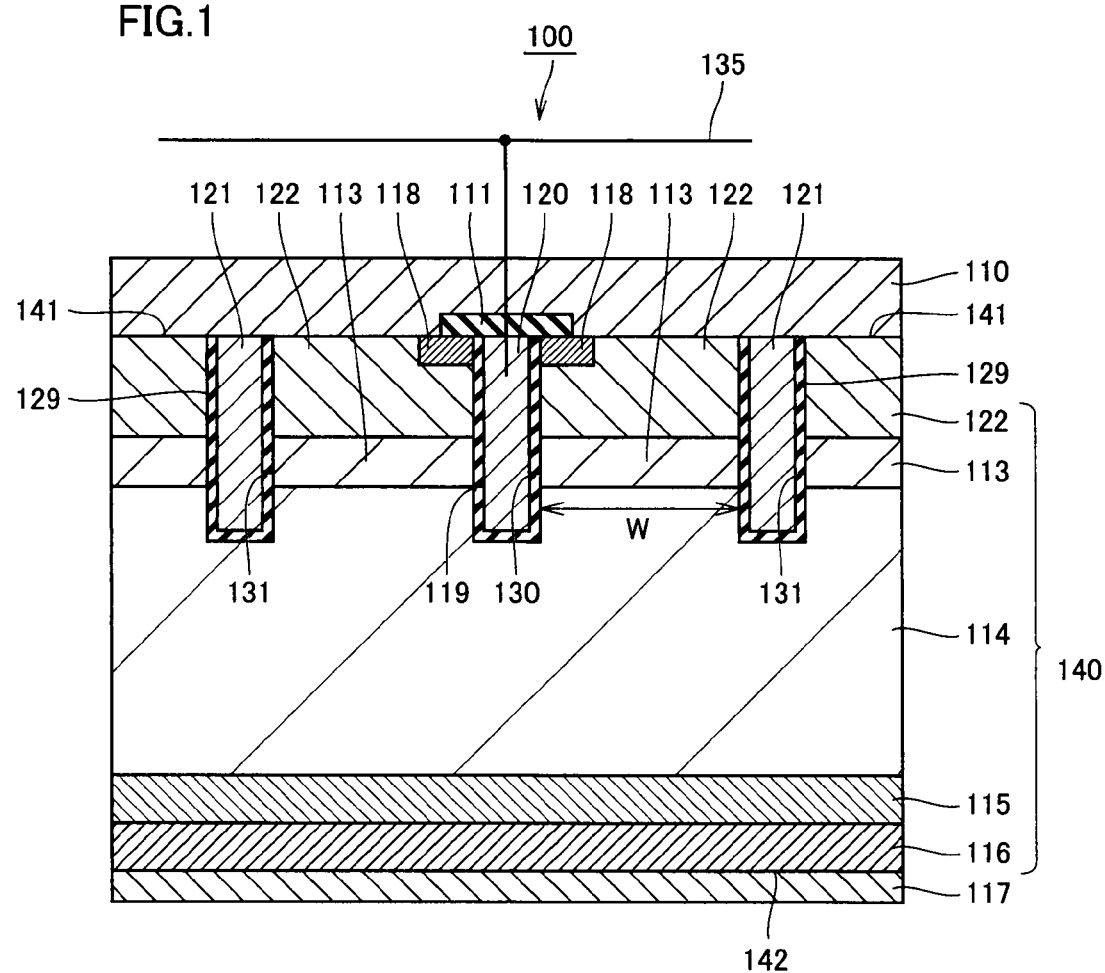
FIG. 1 is a cross-sectional view of a trench-type insulated gate semiconductor device according to a first embodiment of the present invention.

With the use of FIG. 1 to FIG. 4, a semiconductor device according to an embodiment of the present invention will be described. FIG. 1 is a cross-sectional view of a trench-type insulated gate semiconductor device 100 according to a first embodiment of the present invention. As shown in FIG. 1, trench-type insulated gate semiconductor device 100 includes a semiconductor substrate 140 that has a main surface 141 and a main surface 142 located on a side opposite to main surface 141, an n$^-$ semiconductor base (first impurity region) 114 of an n-type (first conductivity type) formed between main surface 141 and main surface 142, and a P collector layer (second impurity region) 116 of a p-type (second conductivity type) formed at main surface 142.

A collector electrode 117 is formed on main surface 142 and connected to P collector layer 116. Further, at a portion inside semiconductor substrate 140 adjacent to P collector layer 116 on a side opposite to collector electrode (second main electrode) 117, an n$^+$ buffer layer 115 of an n-type (first conductivity type) is formed.

At main surface 141, a trench groove 130 that extends from main surface 141 to reach n$^-$ semiconductor base 114, and a trench groove 131 formed on each of opposite sides of trench groove 130 and apart from trench groove 130 are formed. A gate insulating film 119 such as a silicon oxide film is formed at an inner surface of trench groove 130, and a gate insulating film 129 such as a silicon oxide film is also formed at an inner surface of trench groove 131.

Trench groove 130 is filled with a conductive film such as a polysilicon film with gate insulating film (first insulating film) 119 interposed therebetween, so that a gate electrode (first electrode) 120 is formed in trench groove 130. Similarly, trench groove 131 is filled with a conductive film such as a polysilicon film with gate insulating film (second insulating film) 129 interposed therebetween, so that a dummy gate (second electrode) 121 is formed in trench grooves 131.

A gate wiring 135 is connected to gate electrode 120, and hence a gate potential at a prescribed potential can be applied thereto. An emitter electrode 110 is connected to dummy gate 121, and hence a potential different from the potential of gate electrode 120 can be applied thereto.

Emitter electrode (first main electrode) 110 is formed on main surface 141, and extends in a direction along which gate electrode 120 and dummy gate 121 are aligned.

Here, on a top surface of gate electrode 120, an interlayer insulating film 111 such as a silicon oxide film is formed, so that gate electrode 120 is insulated from emitter electrode 110 by interlayer insulating film 111.

At a portion of main surface 141 adjacent to gate electrode 120 on a side facing dummy gate 121, an n$^+$ emitter layer (third impurity region) 118 is formed by selectively diffusing n-type impurities having high concentration. Note that dummy gates 121 are formed on opposite sides of gate electrode 120 in the embodiment of the present invention, and hence emitter layer 118 is formed on each of the opposite sides of gate electrode 120.

At a portion of main surface 141 located between gate electrode 120 and dummy gate 121, there is located a P base region (fourth impurity region) 122 formed by diffusing p-type impurities. P base region 122 is formed to surround emitter layer 118.

Emitter layer 118 and P base region 122 are connected to emitter electrode 110 formed on main surface 141. At least a part of a top surface of emitter layer 118, at least a part of a top surface of P base region 122, and at least a part of a top surface of dummy gate 121 are not covered with interlayer insulating film 111, and in contact with emitter electrode 110.

At a portion in semiconductor substrate 140 located between gate electrode 120 and dummy gate 121, an n$^-$ electric charge storage layer (fifth impurity region) 113 of an n-type is formed. Electric charge storage layer 113 has impurity concentration higher than impurity concentration of n$^-$ semiconductor base 114. Note that each of trench grooves 130, 131 is formed to reach n$^-$ semiconductor base 114 from main surface 141, and to penetrate P base region 122 and electric charge storage layer 113.

Here, electric charge storage layer 113 located between dummy gate 121 and gate electrode 120 is set to have a width W of at most 1.4 μm. Note that in the present specification, the width means a width of electric charge storage layer 113 in a direction along which gate electrode 120 and dummy gate 121 are aligned, and refers to a width in a horizontal direction of the sheet of FIG. 1.

A portion of P base region 122 facing gate electrode 120 and located between emitter layer 118 and electric charge storage layer 113 functions as a channel region, and emitter layer 118 and electric charge storage layer 113 function as source/drain regions.

As such, trench-type insulated gate semiconductor device 100 includes a field-effect transistor that has gate electrode 120, emitter layer 118, P base region 122, and electric charge storage layer 113.

Further, trench-type insulated gate semiconductor device 100 has a pnp transistor structure configured with P base region 122, electric charge storage layer 113, n$^-$ semiconductor base 114, n buffer layer 115, and P collector layer 116. The pnp transistor is controlled by the field-effect transistor described above.

An operation of trench-type insulated gate semiconductor device 100 configured as such will be described.

A collector voltage $V_{CE}$ is applied between emitter electrode 110 and collector electrode 117. In this state, a prescribed positive gate voltage $V_{GE}$ is applied between gate electrode 120 and emitter electrode 110, so that the above-described field-effect transistor is brought into an ON-state. At this time, a channel region in P base region 122 is reversed from a p-type to an n-type, so that a channel is formed. Through this channel, electrons are injected from emitter electrode 110 into electric charge storage layer 113 and n⁻ semiconductor base 114.

The injected electrons bring P collector layer 116 and n⁻ semiconductor base 114 into a forward-biased state, so that holes are injected from P collector layer 116 into n⁻ semiconductor base 114. Thereby resistance of n⁻ semiconductor base 114 is significantly reduced (conductivity modulation), and resistance of trench-type insulated gate semiconductor device 100 is significantly reduced, so that current-carrying capacitance is increased.

Further, electric charge storage layer 113 is formed under P base region 122, and hence the holes that has entered n⁻ semiconductor base 114 from P collector layer 116 can be prevented from reaching emitter electrode 110, and the holes are stored under P base region 122, so that gate-emitter capacitance can be reduced. It is thereby possible to reduce switching loss and gate drive energy.

Further, dummy gates 121 connected to emitter electrode 110 and having their potential fixed are formed on opposite sides of gate electrode 120, and hence even if a potential of P base region 122 located on a side opposite to gate electrode 120 with respect to dummy gate 121 fluctuates, the fluctuating potential is blocked by dummy gate 121. It is thereby possible to reduce an influence exerted on a potential of gate electrode 120.

As such, by disposing dummy gates 121 having an emitter potential around gate electrode 120, a potential of gate electrode 120 does no longer fluctuate, so that an influence of feedback capacitance can be reduced. In connection with this, loss at turn-off can be reduced.

Next, an off operation of trench-type insulated gate semiconductor device 100 will be described. An off-state refers to a state where gate voltage $V_{GE}$ is set to be zero or negative, whereas an on-state refers to a state where positive gate voltage $V_{GE}$ is applied between emitter electrode 110 and gate electrode 120.

Thereby, in P base region 122, the channel region that has been reversed into n-type is returned to p-type, and injection of electrons from emitter electrode 110 into n⁻ semiconductor base 114 is halted. In connection with this, injection of holes from P collector layer 116 into n⁻ semiconductor base 114 is also halted.

Subsequently, electrons and holes stored in n⁻ semiconductor base 114 are recaptured by collector electrode 117 and emitter electrode 110, respectively, or recombined with each other and disappear.

Figure 2:
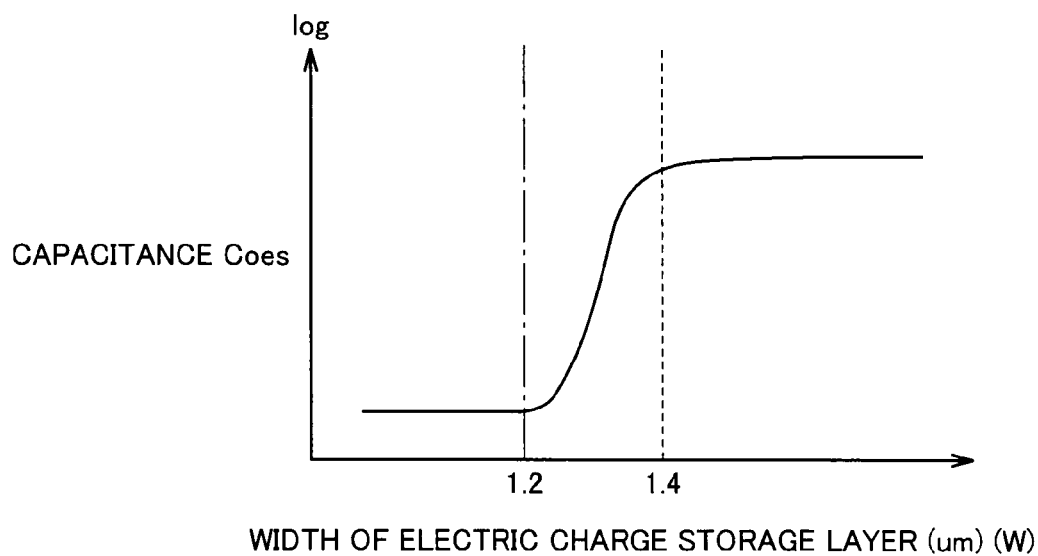
FIG. 2 is a graph that shows fluctuations in output capacitance Coes (capacitance between an emitter electrode and a collector electrode) in the trench-type insulated gate semiconductor device shown in FIG. 1 when a width of a portion of an electric charge storage layer located between a gate electrode and a dummy gate is changed.

FIG. 2 is a graph that shows fluctuations in output capacitance Coes (capacitance between the emitter electrode and the collector electrode) in trench-type insulated gate semiconductor device 100 shown in FIG. 1, when a width of electric charge storage layer (carrier storage layer) 113 located between gate electrode 120 and dummy gate 121 is changed.

As shown in FIG. 2, it is found that output capacitance Coes can be reduced by setting width W of electric charge storage layer 113 to be at most 1.4 μm.

It is found that output capacitance Coes can significantly be reduced by particularly setting width W of electric charge storage layer 113 to be at most 1.2 μm. Note that although the graph shown in FIG. 2 shows output capacitance, feedback capacitance (capacitance between the collector electrode and the gate electrode) exhibits similar properties.

Figure 3:
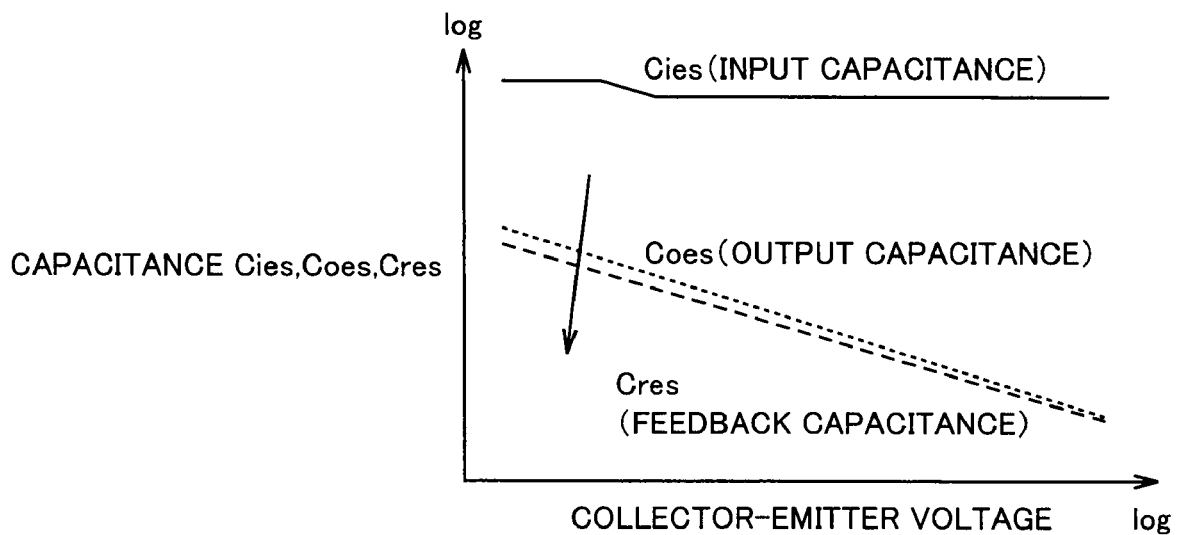
FIG. 3 is a graph that shows changes in input capacitance, output capacitance, and feedback capacitance when a voltage between the collector electrode and the emitter electrode is changed from a low voltage to a high voltage, while a width W of a portion of a P base region located between the gate electrode and the dummy gate is set to be at most 1.4 μm.

FIG. 3 is a graph that shows changes in input capacitance Cies (capacitance between the gate electrode and the emitter electrode), output capacitance Coes (capacitance between the collector electrode and the emitter electrode), and feedback capacitance Cres (capacitance between the collector electrode and the gate electrode) when a voltage between the collector electrode and the emitter electrode is changed from a low voltage to a high voltage, while width W of P base region 122 located between gate electrode 120 and dummy gate 121 is set to be at most 1.4 μm. Note that in the graph shown in FIG. 3, an axis of ordinates indicates input capacitance, output capacitance, and feedback capacitance, while an axis of abscissas logarithmically indicates a voltage between the collector electrode and the emitter electrode.

As shown in FIG. 3, it is found that input capacitance hardly fluctuates when a voltage is fluctuated. With respect to a logarithmic value of the voltage between the collector electrode and the emitter electrode, output capacitance and feedback capacitance are monotonously decreased.

Figure 4:
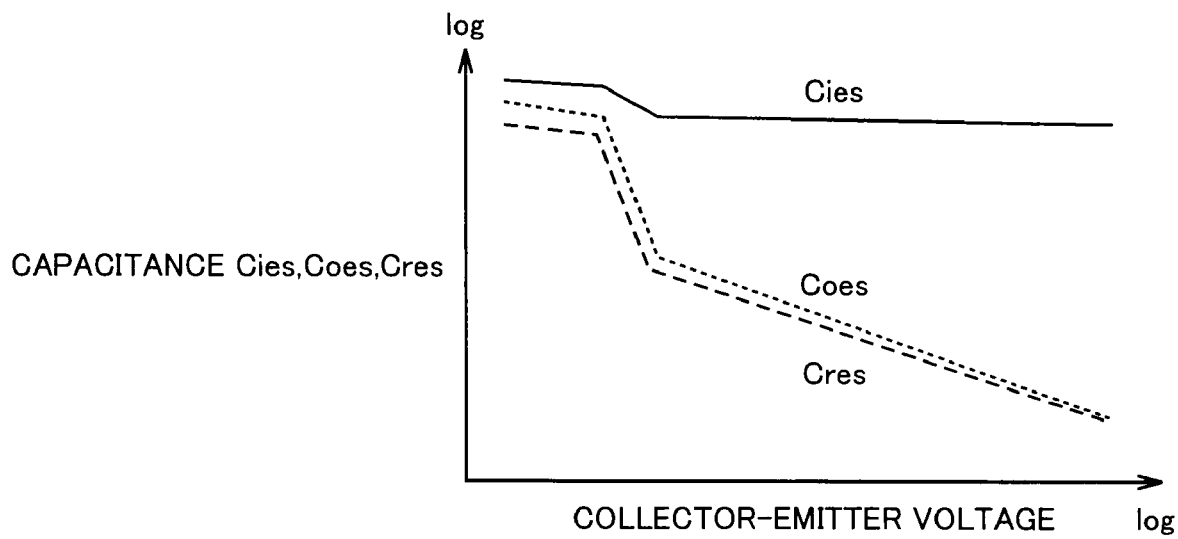
FIG. 4 is a graph that shows changes in input capacitance, output capacitance, and feedback capacitance in the trench-type insulated gate semiconductor device shown in FIG. 1 when a width of the P base region is made larger than 1.4 μm.

FIG. 4 is a graph that shows changes in input capacitance Cies (capacitance between the gate electrode and the emitter electrode), output capacitance Coes (capacitance between the collector electrode and the emitter electrode), and feedback capacitance Cres (capacitance between the collector electrode and the gate electrode) in trench-type insulated gate semiconductor device 100 shown in FIG. 1 when a width of P base region 122 is made larger than 1.4 μm.

In the graph shown in FIG. 4, an axis of abscissas logarithmically indicates a voltage between the collector electrode and the emitter electrode, while an axis of ordinates indicates input capacitance, output capacitance, and feedback capacitance.

As shown in the graph in FIG. 4, in the storage-type IGBT that serves as a comparative example, it is found that, if a voltage between the collector electrode and the emitter electrode reaches a prescribed voltage, output capacitance and feedback capacitance significantly fluctuate. As shown in FIG. 4, fluctuations in output capacitance and feedback capacitance cause electromagnetic noise, and hence a malfunction may occur when the device is mounted and activated.

In contrast, as described above, in trench-type insulated gate semiconductor device 100 according to the embodiment of the present invention, even if a voltage between the collector electrode and the emitter electrode is fluctuated, it is possible to suppress significant fluctuations in output capacitance and feedback capacitance, as shown in FIG. 3, and hence generation of electromagnetic noise can be suppressed.

(Second Embodiment)

With the use of FIG. 5 to FIG. 11, trench-type insulated gate semiconductor device 100 according to an embodiment of the present invention and a method of manufacturing the same will be described.

Note that in FIG. 5 to FIG. 11, the configurations same as or corresponding to the configurations shown in FIG. 1 to FIG. 4 described above are provided with the same reference characters, and the description thereof will not be repeated.

Figure 5:
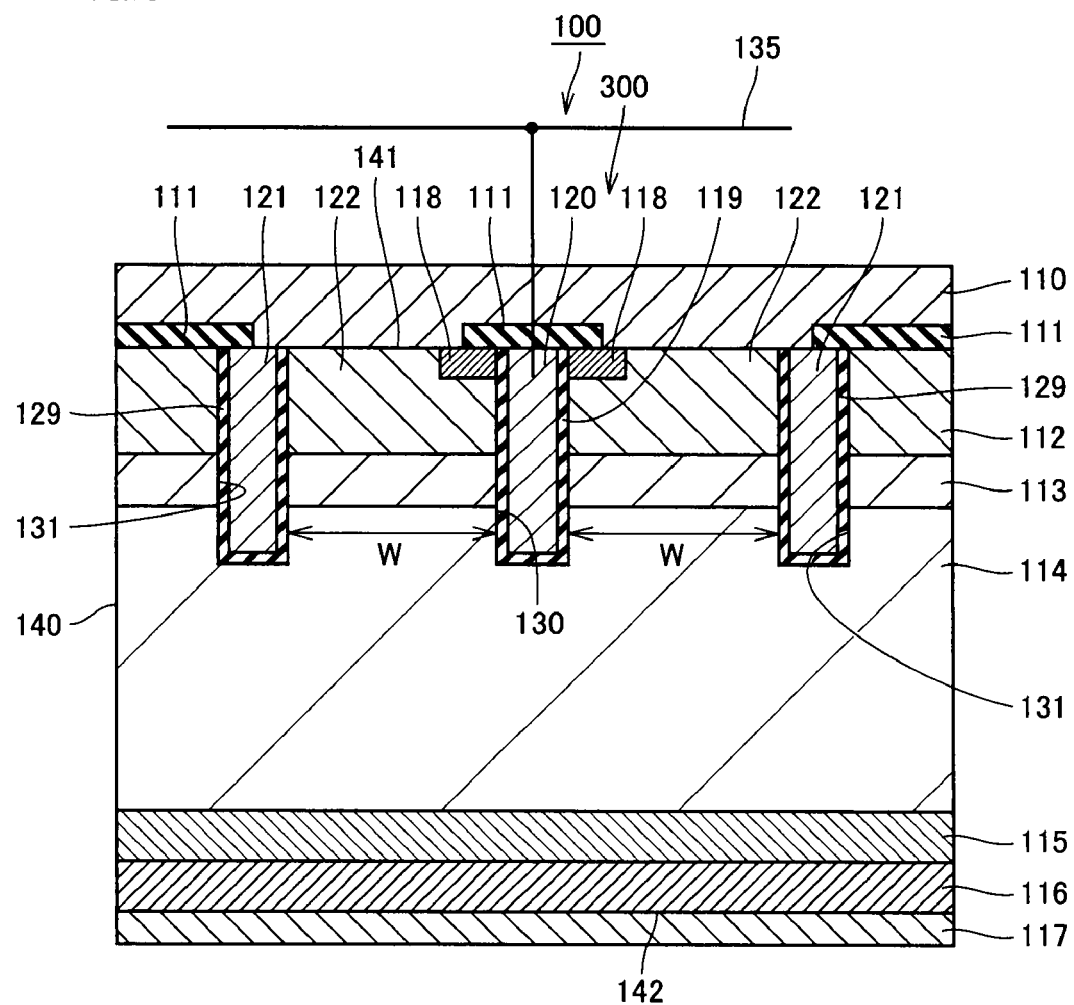
FIG. 5 is a cross-sectional view of a trench-type insulated gate semiconductor device according to a second embodiment of the present invention.

FIG. 5 is a cross-sectional view of trench-type insulated gate semiconductor device 100 according to a second embodiment of the present invention. As shown in FIG. 5, a cell 300 of trench-type insulated gate semiconductor device 100 includes gate electrode 120 connected to gate wiring 135, dummy gates 121 provided apart from gate electrode 120 on opposite sides of gate electrode 120, P base region 122 provided between gate electrode 120 and dummy gate 121 and connected to emitter electrode 110, and emitter layer 118 located on P base region 122 and adjacent to gate electrode 120 on each of the opposite sides of gate electrode 120.

Further, floating region 112 is formed at a portion of main surface 141 located on a side opposite to P base region 122 with respect to dummy gate 121. On a top surface of floating region 112, interlayer insulating film 111 is formed. Interlayer insulating film 111 insulates floating region 112 and emitter electrode 110 from each other.

Thereby, during an ON operation of trench-type insulated gate semiconductor device 100, holes that has entered n⁻ semiconductor base 114 cannot enter floating region 112, and hence pass through P base region 122 and enter emitter electrode 110. Therefore, hole density on the periphery of P base region 122 is increased and injection of electrons is promoted (IE: injection enhancement), so that an on-voltage can be made low.

Note that in trench-type insulated gate semiconductor device 100 according to the embodiment of the present invention, width W of electric charge storage layer 113 located between gate electrode 120 and dummy gate 121 is also set to be at most 1.4 μm, preferably at most 1.2 μm. Generation of electromagnetic noise is thereby suppressed as in trench-type insulated gate semiconductor device 100 according to the first embodiment described above.

With the use of FIG. 6 to FIG. 11, the method of manufacturing trench-type insulated gate semiconductor device 100 according to the embodiment of the present invention will be described.

Figure 6:
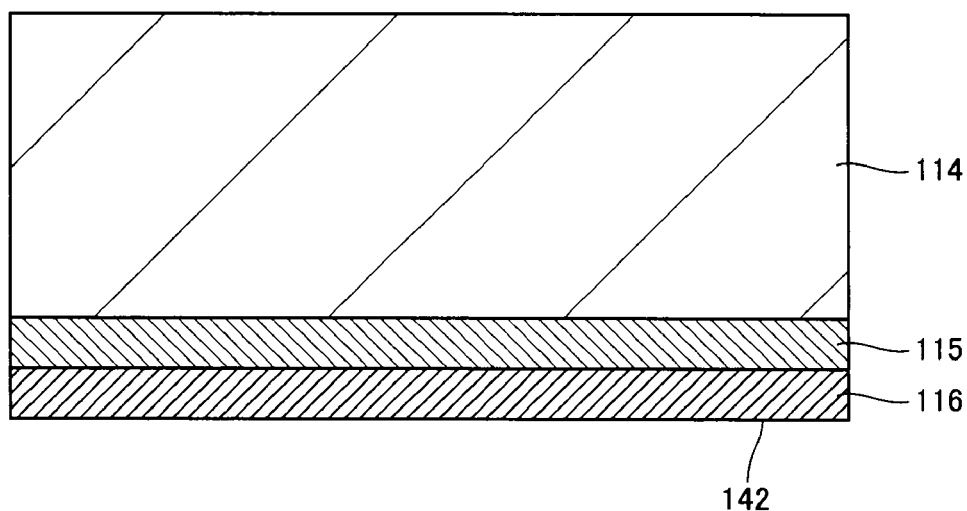
FIG. 6 is a cross-sectional view that shows a first step in a step of manufacturing a trench-type insulated gate semiconductor device.

FIG. 6 is a cross-sectional view that shows a first step in a step of manufacturing trench-type insulated gate semiconductor device 100. As shown in FIG. 6, a P⁺ substrate such as a P-type silicon substrate (P collector layer 116) is prepared. As shown in FIG. 6, n buffer layer 115 and n⁻ semiconductor base 114 are successively formed at a main surface (top surface) of the P⁺ substrate by a selective epitaxial method or the like.

Figure 7:
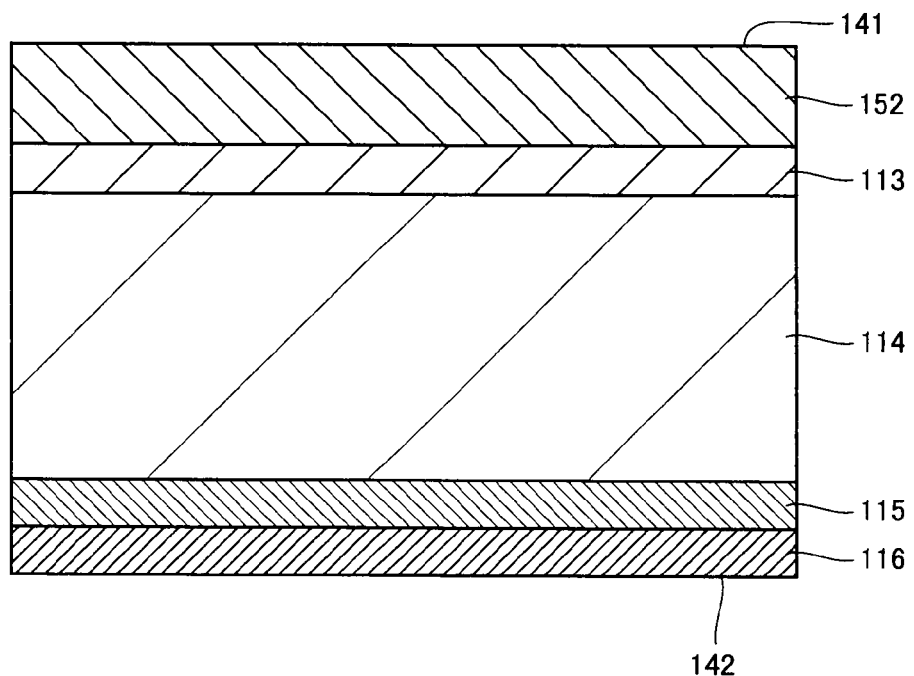
FIG. 7 is a cross-sectional view that shows a second step in the step of manufacturing the trench-type insulated gate semiconductor device.

FIG. 7 is a cross-sectional view that shows a second manufacturing step in the step of manufacturing trench-type insulated gate semiconductor device 100. As shown in FIG. 7, N-type impurities are injected from a top surface of n⁻ semiconductor base 114 into the whole surface thereof and then thermally diffused, to thereby form electric charge storage layer 113 at an upper portion of n⁻ semiconductor base 114.

After electric charge storage layer 113 is formed, P-type impurities are injected from a top surface of electric charge storage layer 113 and thermally diffused, to thereby form a P layer 152.

Figure 8:
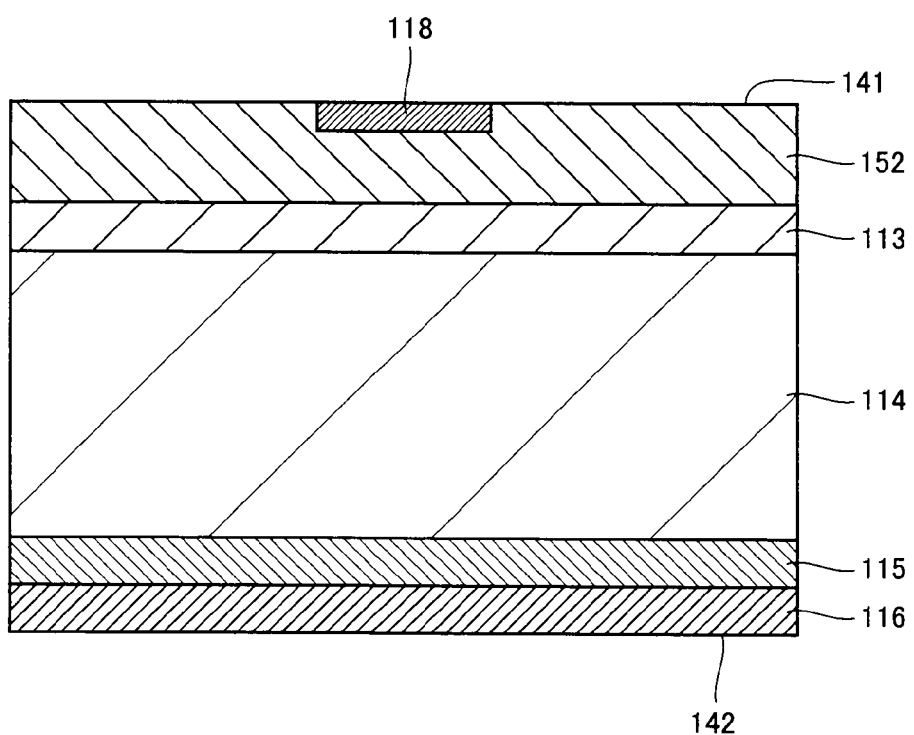
FIG. 8 is a cross-sectional view that shows a third step in the step of manufacturing the trench-type insulated gate semiconductor device.

FIG. 8 is a cross-sectional view that shows a third step in the step of manufacturing trench-type insulated gate semiconductor device 100. As shown in FIG. 8, N-type impurities are selectively injected on a top surface of P layer 152 and then thermally diffused, to thereby form emitter layer 118.

Figure 9:
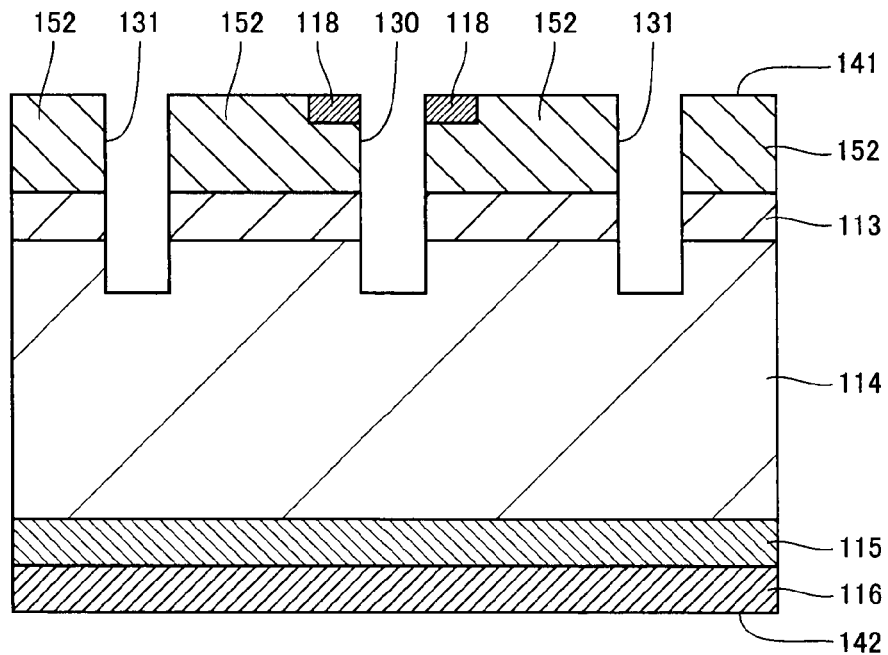
FIG. 9 is a cross-sectional view that shows a fourth step in the step of manufacturing the trench-type insulated gate semiconductor device.

FIG. 9 is a cross-sectional view that shows a fourth step in the step of manufacturing trench-type insulated gate semiconductor device 100. As shown in FIG. 9, main surface 141 is etched to form trench groove 130 and trench groove 131 located apart from trench groove 130. Here, trench groove 130 is formed to penetrate emitter layer 118, P layer 152, and electric charge storage layer 113 and reach n⁻ semiconductor base 114. Emitter layer 118 is split into two by trench groove 130. In contrast, trench groove 131 is formed to penetrate P layer 152 and electric charge storage layer 113 and reach n⁻ semiconductor base 114.

Note that by performing etching such that trench grooves 131 are equally spaced apart from trench grooves 130, a depth of trench groove 130 can be made approximately equal to a depth of trench grooves 131.

Figure 10:
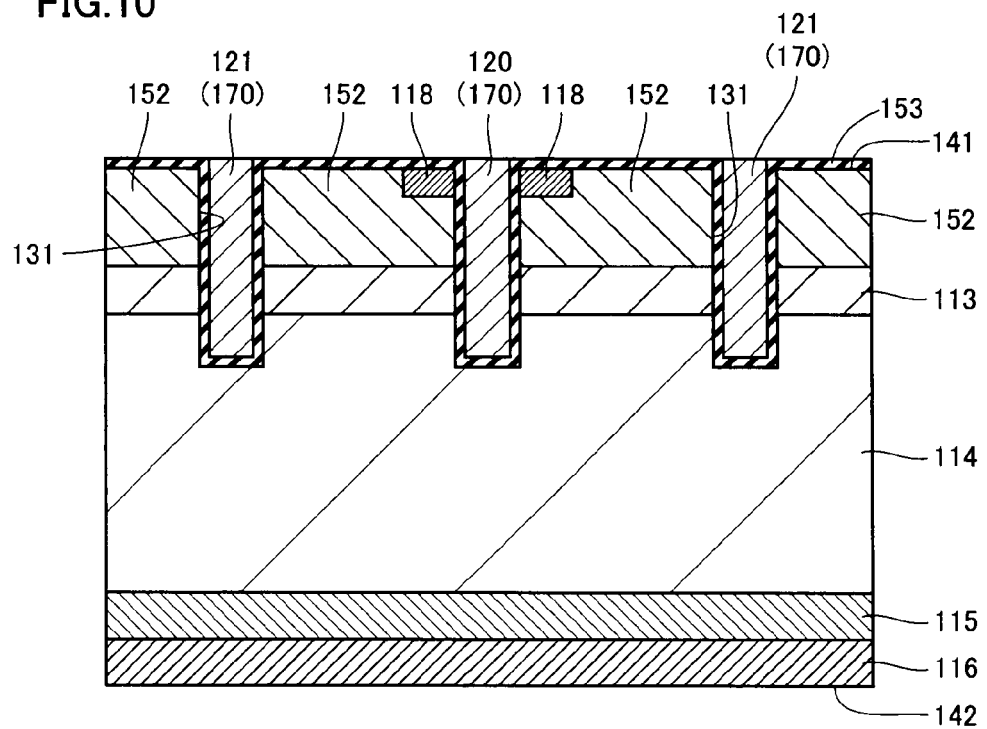
FIG. 10 is a cross-sectional view that shows a fifth step in the step of manufacturing the trench-type insulated gate semiconductor device.

FIG. 10 is a cross-sectional view that shows a fifth step in the step of manufacturing trench-type insulated gate semiconductor device 100. As shown in FIG. 10, an insulating film 153 such as a silicon oxide film is formed on main surface 141, at an inner surface of trench groove 131, and at an inner surface of trench groove 130 by performing, for example, a thermal oxidation process.

Subsequently, a conductive film 170 such as a polysilicon film is deposited on main surface 141 to fill trench groove 130 and trench groove 131 with conductive film 170. Conductive film 170 is then etched to thereby form gate electrode 120 that fills trench groove 130, and form dummy gate 121 that fills trench groove 131.

Figure 11:
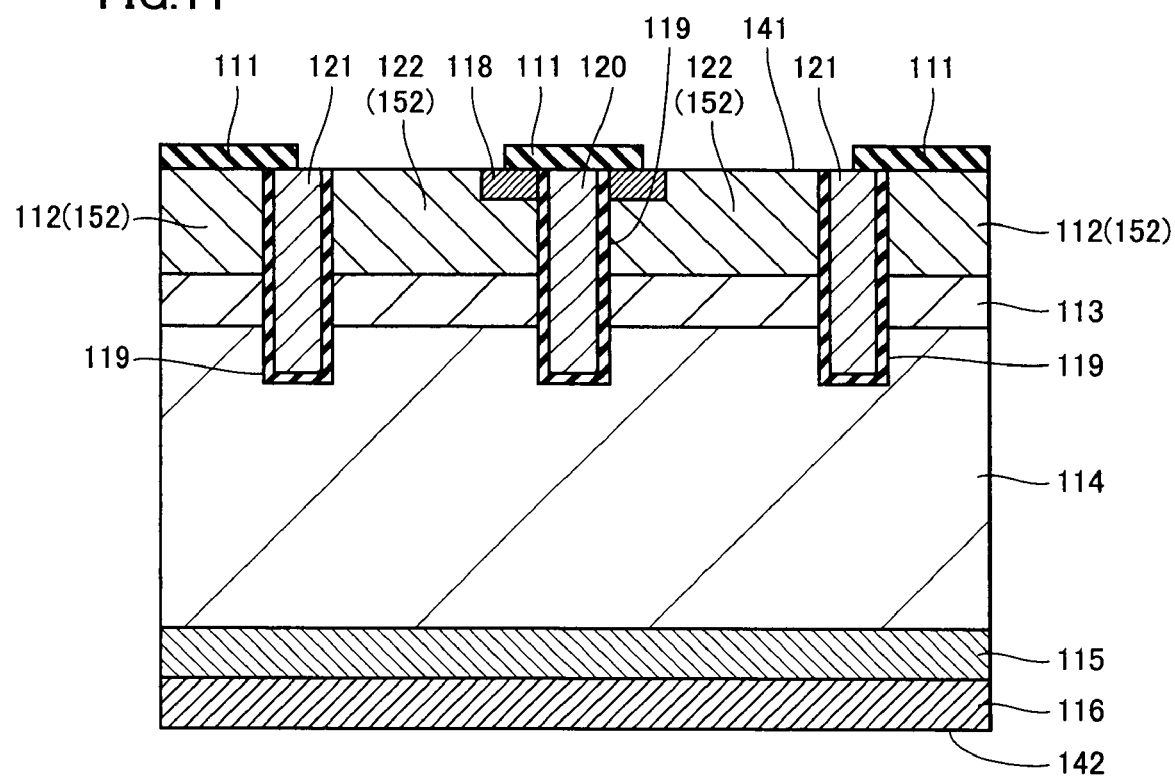
FIG. 11 is a cross-sectional view that shows a sixth step in the step of manufacturing the trench-type insulated gate semiconductor device.

FIG. 11 is a cross-sectional view that shows a sixth step in the step of manufacturing trench-type insulated gate semiconductor device 100. As shown in FIG. 11, an insulating film such as a silicon oxide film is deposited on main surface 141. The insulating film is patterned to expose at least at least a part of a top surface of emitter layer 118, a top surface of a portion of P layer 152 located between gate electrode 120 and dummy gate 121, and at least a part of a top surface of dummy gate 121.

In contrast, the insulating film is allowed to remain such that it covers the whole top surface of a portion of P layer 152 adjacent to dummy gate 121 on a side opposite to gate electrode 120, and also covers the whole top surface of gate electrode 120. As such, interlayer insulating film 111 is formed.

In connection with this, floating region 112 is formed, and P base regions 122 are formed on opposite sides of gate electrode 120.

As shown in FIG. 5, emitter electrode 110 and collector electrode 117 are formed by sputtering or the like. At this time, at least a part of the top surface of emitter layer 118 and the top surface of P base region 122 are exposed. Therefore, emitter layer 118 and P base region 122 are connected to emitter electrode 110. Further, dummy gate 121 is connected to emitter electrode 110.

An insulating film such as a silicon oxide film or a silicon nitride film is then deposited on a top surface of emitter electrode 110, for example, to form an interlayer insulating film. A contact hole is formed from a top surface of the interlayer insulating film such that it reaches gate electrode 120, and is filled with a metal film such as aluminum (Al) or an aluminum alloy. Gate wiring 135 is then formed on the interlayer insulating film. As such, trench-type insulated gate semiconductor device 100 shown in FIG. 5 described above is formed.

(Third Embodiment)

With the use of FIG. 12, trench-type insulated gate semiconductor device 100 according to a third embodiment of the present invention will be described. Note that in FIG. 12, the configurations same as or corresponding to the configurations shown in FIG. 1 to FIG. 11 described above are provided with the same reference characters, and the description thereof may not be repeated.

Figure 12:
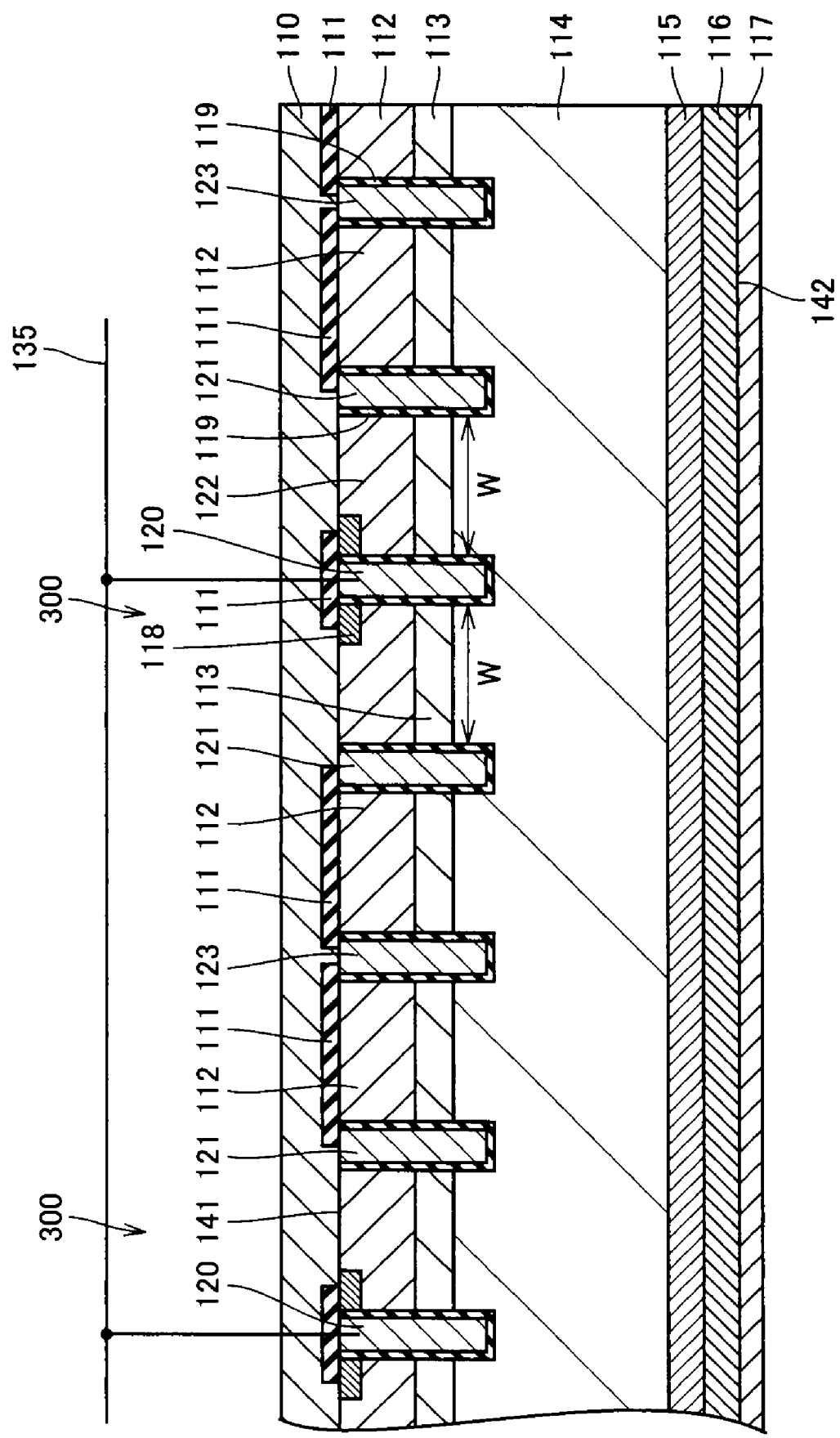
FIG. 12 is a cross-sectional view for describing a trench-type insulated gate semiconductor device according to a third embodiment of the present invention.

As shown in FIG. 12, trench-type insulated gate semiconductor device 100 includes a plurality of cells 300 disposed apart from one another.

Cell 300 includes gate electrode 120 connected to gate wiring 135, dummy gates 121 disposed apart from gate electrode 120 on the opposite sides thereof, P base region 122 located between gate electrode 120 and dummy gate 121, and emitter layer 118 located on P base region 122 and formed on each of the opposite sides of gate electrode 120. Floating region (sixth impurity region) 112 is formed on a side opposite to P base region 122 with respect to dummy gate 121.

Here, floating region 112 is formed between adjacent cells 300, and dummy gates 121 are disposed on opposite sides of floating region 112. At a central portion of floating region 112, a split dummy gate (split electrode) 123 is formed. Split dummy gate 123 is connected to emitter electrode 110, just as dummy gate 121 is connected thereto.

Split dummy gate 123 splits floating region 112. Note that although split dummy gate 123 splits floating region 112 into two in the example shown in FIG. 12, a plurality of split dummy gates 123 may be disposed in floating region 112 to split floating region 112 into more sections.

Here, if floating region 112 having a large width is to be formed without forming split dummy gate 123, trench grooves for gate electrodes 120 and dummy gates 121 are distributed in a nonuniform manner. Accordingly, in the step of forming trench grooves, a trench groove for dummy gate 121 tends to be larger or deeper than a trench groove for gate electrode 120. In connection with this, a trench groove for dummy gate 121 tends to be distorted or the like, and the shape of floating region 112 defined by dummy gate 121 is distorted or the like, so that electric field concentration or the like tends to occur in floating region 112.

In contrast, in the embodiment of the present invention, it is possible to suppress nonuniform distribution of the trench grooves in the step of forming trench grooves, by forming at least one split dummy gate 123 between dummy gates 121.

In connection with this, trench grooves for gate electrode 120, dummy gate 121, and split dummy gate 123 can be formed in an approximately uniform manner, so that it is possible to suppress distortion or the like of each of the trench grooves.

It is thereby possible to suppress distortion or the like of the shape of a portion of floating region 112 located between split dummy gate 123 and dummy gate 121, and if a plurality of split dummy gates 123 are formed, located between split dummy gates 123.

As such, with trench-type insulated gate semiconductor device 100 according to the embodiment of the present invention and the method of manufacturing the same, it is possible to suppress distortion or the like of each floating region 112, and hence suppress electric field concentration or the like in floating region 112.

Note that split dummy gate 123 is preferably disposed such that a distance between gate electrode 120 and dummy gate 121 is approximately equal to a distance between dummy gate 121 and split dummy gate 123. The trench grooves are thereby distributed in an approximately uniform manner, and each of the trench grooves can favorably be formed.

Each split dummy gate 123 is formed such that it reaches n⁻ semiconductor base 114 from main surface 141 and enters n⁻ semiconductor base 114.

A volume of n⁻ semiconductor base 114 can thereby be kept smaller, when compared with the case where split dummy gate 123 is not formed.

In connection with this, it is possible to reduce an amount of holes and an amount of electric charge stored in n⁻ semiconductor base 114 in an ON-state. In addition, when trench-type insulated gate semiconductor device 100 is switched from an ON-state to an OFF-state, it is possible to reduce time required for ejecting holes and electric charge stored in n⁻ semiconductor base 114 to emitter electrode 110 or collector electrode 117. It is thereby possible to reduce turn-off time.

Note that in trench-type insulated gate semiconductor device 100 according to the embodiment of the present invention, width W of a portion of electric charge storage layer 113 located between gate electrode 120 and dummy gate 121 is also set to be at most 1.4 μm (preferably at most 1.2 μm). Therefore, it is also possible, in trench-type insulated gate semiconductor device 100 according to the third embodiment of the present invention, to suppress fluctuations in output capacitance and feedback capacitance, and suppress an adverse effect such as electromagnetic noise, as in trench-type insulated gate semiconductor device 100 according to the first embodiment described above.

(Fourth Embodiment)

Figure 13:
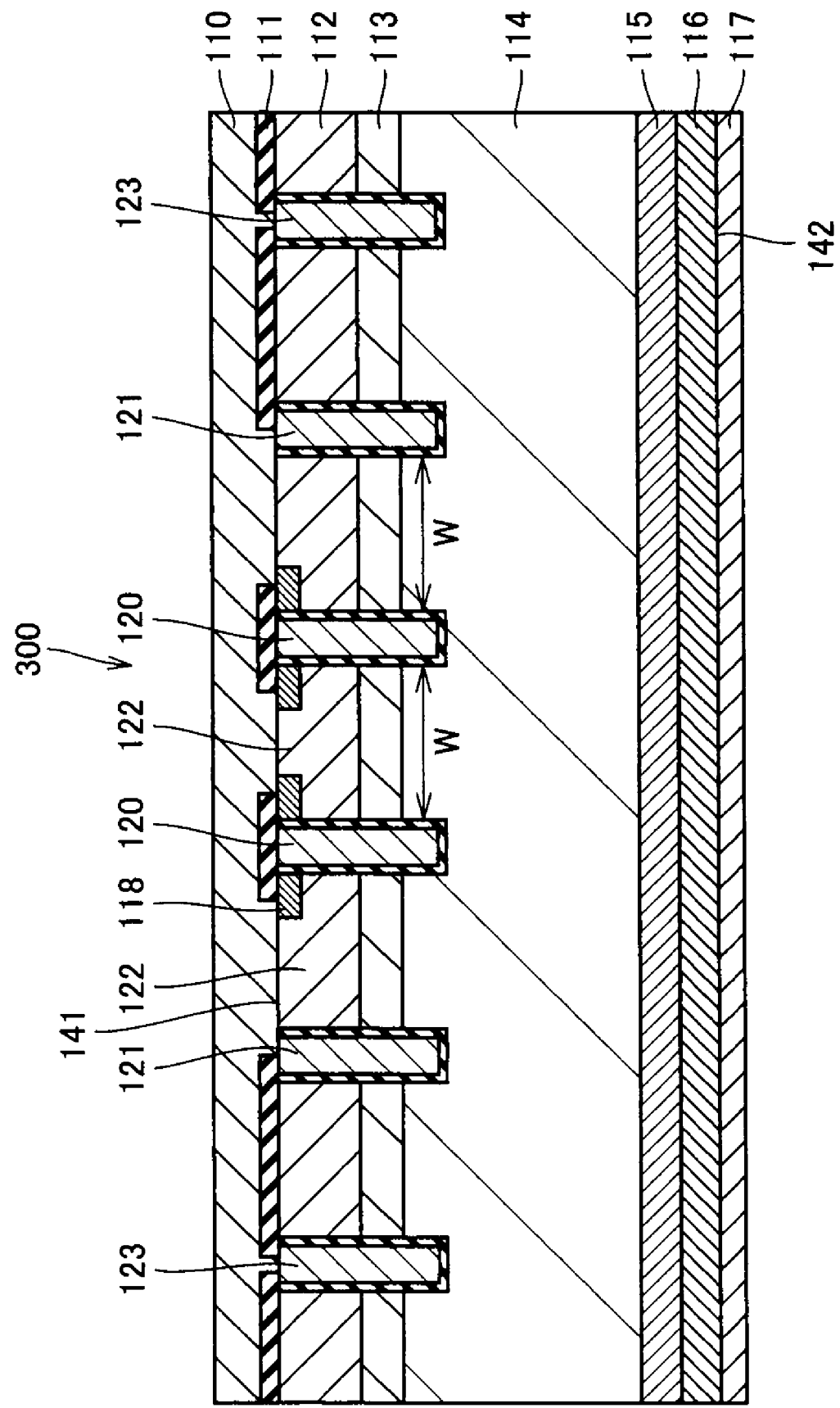
FIG. 13 is a cross-sectional view for describing a trench-type insulated gate semiconductor device according to a fourth embodiment of the present invention.

With the use of FIG. 13, trench-type insulated gate semiconductor device 100 according to a fourth embodiment of the present invention will be described. In FIG. 13, the configurations same as or corresponding to the configurations shown in FIG. 1 to FIG. 12 described above are provided with the same reference characters, and the description thereof will not be repeated.

Cell 300 of trench-type insulated gate semiconductor device 100 shown in FIG. 13 includes two (a plurality of) gate electrodes 120 formed apart from each other, and dummy gate 121 provided on a side opposite to the farther gate electrode 120 with respect to the closer gate electrode 120.

Further, cell 300 includes P base regions 122 formed between gate electrodes 120 and between gate electrode 120 and dummy gate 121. Cell 300 includes electric charge storage layer 113 located between gate electrodes 120 and between gate electrode 120 and dummy gate 121, and formed at portions located between P base region 122 and n⁻ semiconductor base 114.

Emitter layer 118 is formed at a portion that is located on P base region 122 and adjacent to each gate electrode 120 on each of opposite sides of the gate electrode 120.

By providing a plurality of gate electrodes 120 and providing emitter layers 118 for each gate electrode 120, it is possible to increase a saturation current of trench-type insulated gate semiconductor device 100.

Note that in trench-type insulated gate semiconductor device 100 according to the fourth embodiment of the present invention, a width of each portion of electric charge storage layer 113 located between gate electrodes 120, and between gate electrode 120 and dummy gate 121, is also set to be at most 1.4 μm (preferably at most 1.2 μm), so that fluctuations in output capacitance and feedback capacitance are suppressed, and generation of electromagnetic noise is suppressed.

(Fifth Embodiment)

Figure 14:
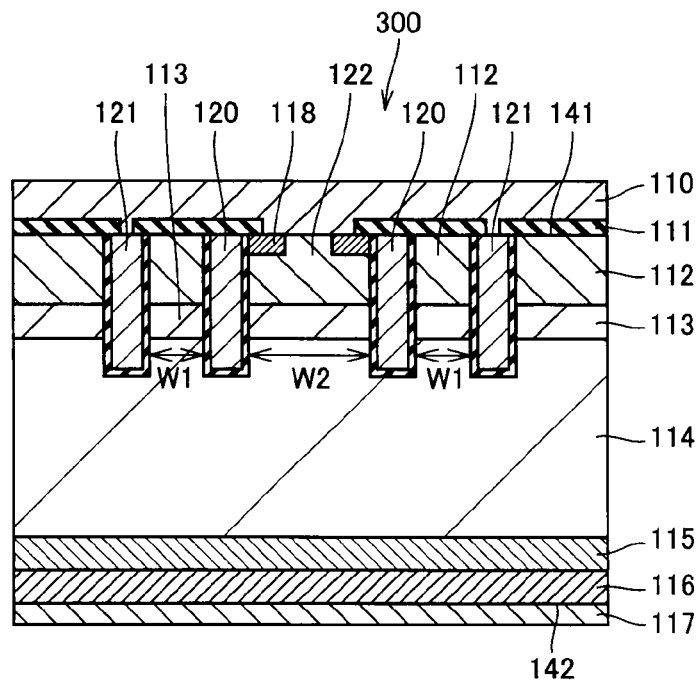
FIG. 14 is a cross-sectional view for describing a trench-type insulated gate semiconductor device according to a fifth embodiment of the present invention.

With the use of FIG. 14, trench-type insulated gate semiconductor device 100 according to a fifth embodiment of the present invention will be described. Note that the configurations shown in FIG. 14 that are the same as or correspond to the configurations shown in FIG. 1 to FIG. 13 described above are provided with the same reference characters, and the description thereof may not be repeated. FIG. 14 is a cross-sectional view of trench-type insulated gate semiconductor device 100 according to the fifth embodiment of the present invention.

As shown in FIG. 14, cell 300 includes two (a plurality of) gate electrodes 120 formed apart from each other, P base region 122 formed at a portion of main surface 141 located between gate electrodes 120, and emitter layer 118 formed at a portion of main surface 141 that is adjacent to each of gate electrodes 120 on a side facing the other of gate electrodes 120.

Further, dummy gate 121 is formed at a portion adjacent to gate electrode 120 on a side opposite to the farther gate electrode 120 with respect to gate electrode 120.

Floating region 112 is formed on a portion of main surface 141 located between dummy gate 121 and gate electrode 120.

Here, a width W1 between dummy gate 121 and gate electrode 120 is made to be smaller than a width W2 between gate electrodes 120. Therefore, a width of each portion of charge storage layer 113 and floating region 112 located between gate electrode 120 and dummy gate 121 is smaller than a width of each portion of electric charge storage layer 113 and P base region 122 located between gate electrodes 120.

The width of floating region 112 is kept small as such, and hence even if a potential of floating region 112 located between gate electrode 120 and dummy gate 121 fluctuates, an influence exerted on a potential of gate electrode 120 can be kept small. It is thereby possible to suppress a misoperation or the like of trench-type insulated gate semiconductor device 100.

Note that in trench-type insulated gate semiconductor device 100 according to the embodiment of the present invention, width W2 is also set to be at most 1.4 µm, and preferably at most 1.2 µm. Fluctuations in output capacitance, input capacitance, and drive capacitance are thereby reduced, and generation of electromagnetic noise is suppressed.

(Sixth Embodiment)

With the use of FIG. 15, trench-type insulated gate semiconductor device 100 according to a sixth embodiment of the present invention will be described. Note that the configurations shown in FIG. 15 that are the same as or correspond to the configurations shown in FIG. 1 to FIG. 14 described above are provided with the same reference characters, and the description thereof may not be repeated.

Figure 15:
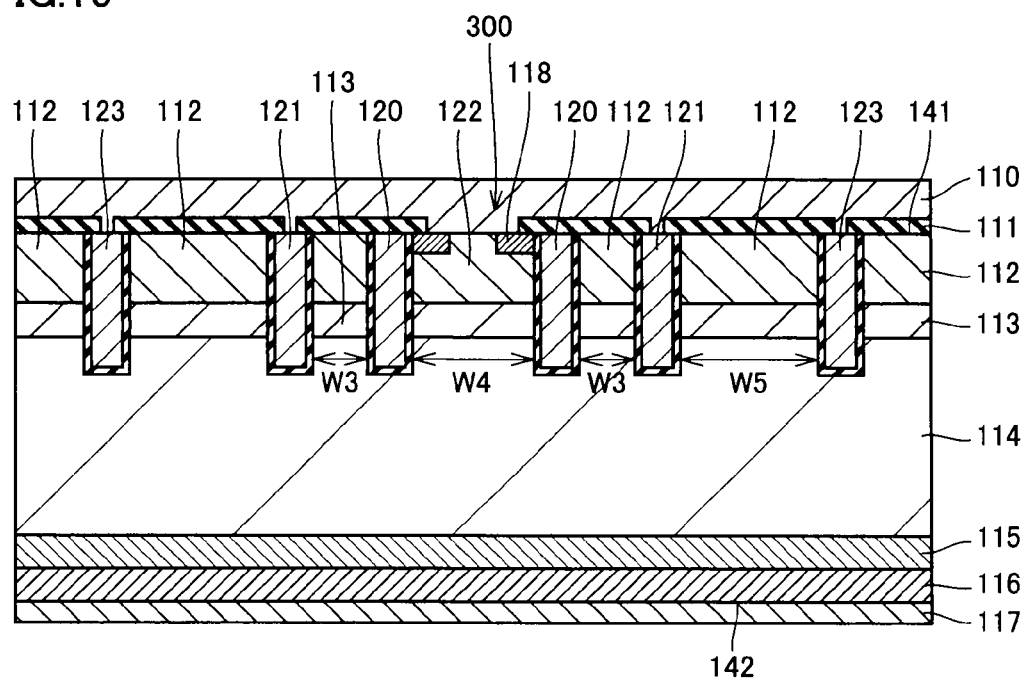
FIG. 15 is a cross-sectional view for describing a trench-type insulated gate semiconductor device according to a sixth embodiment of the present invention.

FIG. 15 is a cross-sectional view of trench-type insulated gate semiconductor device 100 according to the sixth embodiment of the present invention. As shown in FIG. 15, cell 300 includes gate electrodes 120 provided apart from each other, P base region 122 formed at a portion of main surface 141 located between gate electrodes 120, and dummy gate 121 provided apart from each of gate electrodes 120.

Split dummy gate 123 is formed apart from dummy gate 121 on a side opposite to gate electrode 120 with respect to dummy gate 121. Floating region 112 is formed between gate electrode 120 and dummy gate 121, between dummy gate 121 and split dummy gate 123, and at a portion located on a side opposite to dummy gate 121 with respect to split dummy gate 123.

Here, a width W3 between gate electrode 120 and dummy gate 121 is smaller than a width W5 between dummy gate 121 and split dummy gate 123.

A width of a portion of floating region 112 located between gate electrode 120 and dummy gate 121 is thereby made small, so that even if a potential of the portion of floating region 112 located between gate electrode 120 and dummy gate 121 fluctuates, an influence exerted on a potential of gate electrode 120 can be kept small.

Note that even if a potential of a portion of floating region 112 located between dummy gate 121 and split dummy gate 123 fluctuates, dummy gate 121 reduces an influence exerted on gate electrode 120 by the fluctuations in potential of the relevant portion of floating region 112.

Further, a plurality of split dummy gates 123 are formed, and hence each of the trench grooves can favorably be formed. By splitting floating region 112 by split dummy gate 123, floating region 112 to be segmented can favorably be miniaturized, and electric field concentration in each floating region 112 can be suppressed.

Further in trench-type insulated gate semiconductor device 100 according to the sixth embodiment of the present invention, a width W4 of a portion of electric charge storage layer 113 located between gate electrodes 120 is also set to be at most 1.4 µm (preferably at most 1.2 µm), and fluctuations in output capacitance and feedback capacitance are kept small. Generation of electromagnetic noise is thereby suppressed.

(Seventh Embodiment)

With the use of FIG. 16, trench-type insulated gate semiconductor device 100 according to a seventh embodiment of the present invention will be described. Note that the configurations shown in FIG. 16 that are the same as or correspond to the configurations shown in FIG. 1 to FIG. 15 described above are provided with the same reference characters, and the description thereof may not be repeated.

Figure 16:
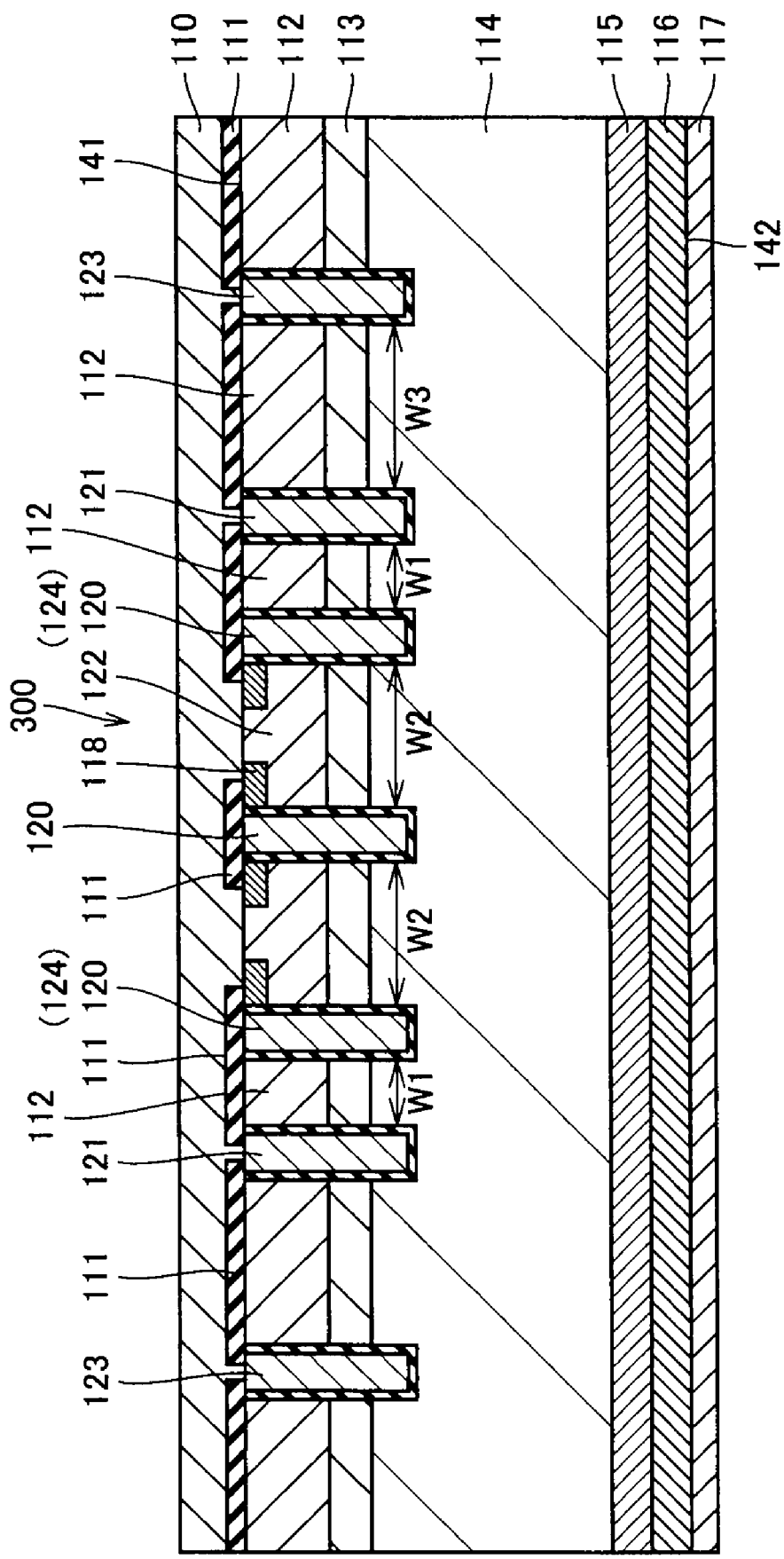
FIG. 16 is a cross-sectional view for describing a trench-type insulated gate semiconductor device according to a seventh embodiment of the present invention.

In FIG. 16, cell 300 includes three (a plurality of) gate electrodes 120 provided apart from one another, P base region 122 formed on each portion of main surface 141 located between gate electrodes 120, and emitter layer 118 formed on each portion of main surface 141 located adjacent to gate electrode 120 on a side facing the opposite gate electrode 120. Further, cell 300 includes electric charge storage layer 113 formed under each P base region 122.

Here, each P base region 122 is connected to emitter electrode 110, so that a certain contact area between P base region 122 and emitter electrode 110 is ensured, and it is possible to ensure a large saturation current of trench-type insulated gate semiconductor device 100.

Dummy gate 121 is formed apart from each gate electrode 124, which is one of the plurality of gate electrodes 120 located outermost in a direction along which gate electrodes 120 are aligned.

Stated differently, dummy gates 121 formed apart from each other are disposed, and the plurality of gate electrodes 120 are formed apart from one another on a portion of main surface 141 located between these dummy gates 121.

Floating region 112 is formed between gate electrode 120 and dummy gate 121.

A plurality of split dummy gates 123 are formed apart from one another on a side opposite to gate electrode 124 with respect to dummy gate 121, and floating region 112 is formed on a portion of main surface 141 located between dummy gate 121 and split dummy gate 123.

Here, width W1 between gate electrode 120 (124) and dummy gate 121 is smaller than width W3 between dummy gate 121 and split dummy gate 123.

By decreasing width W1 between gate electrode 120 (124) and dummy gate 121 as such, even if a potential of floating region 112 located between gate electrode 120 (124) and dummy gate 121 fluctuates, it is possible to reduce an influence thereof exerted on gate electrode 120 (124).

Further, by providing split dummy gate 123, it is possible to avoid a mixture of a portion where traces are densely formed, and a portion where traces are sparsely formed on a resist pattern to be formed on main surface 141 in the step of forming trench grooves, as shown in FIG. 9 described above, so that trench grooves can favorably be formed.

In connection with this, floating region 112 can favorably be configured, and it is possible to suppress an adverse effect such as electric field concentration in floating region 112.

Gate electrode 120, dummy gate 121, and split dummy gate 123 are formed to reach n⁻ semiconductor base 114 from main surface 141, so that a volume of n⁻ semiconductor base 114 is reduced.

It is thereby possible to reduce an amount of holes stored in n⁻ semiconductor base 114, and reduce turn-off time during switching to OFF.

By forming the plurality of dummy gates 121 and split dummy gates 123, in particular, time required for turn-off can further be reduced.

Note that in trench-type insulated gate semiconductor device 100 according to the embodiment of the present invention, width W2 of electric charge storage layer 113 located between gate electrodes 120 is also set to be at most 1.4 µm, and hence functions and effects similar to those of trench-type insulated gate semiconductor device 100 according to the first embodiment described above can be obtained.

(Eighth Embodiment)

With the use of FIG. 17, trench-type insulated gate semiconductor device 100 according to an eighth embodiment of the present invention will be described. Note that the configurations shown in FIG. 17 that are the same as or correspond to the configurations shown in FIG. 1 to FIG. 16 described above are provided with the same reference characters, and the description thereof will not be repeated.

Figure 17:
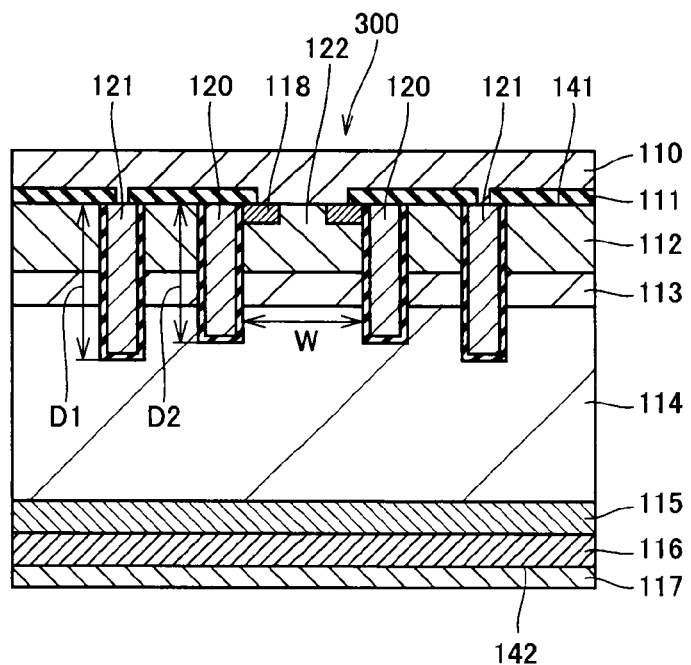
FIG. 17 is a cross-sectional view for describing a trench-type insulated gate semiconductor device according to an eighth embodiment of the present invention.

FIG. 17 is a cross-sectional view of trench-type insulated gate semiconductor device 100 according to the eighth embodiment of the present invention. Cell 300 of trench-type insulated gate semiconductor device 100 shown in FIG. 17 includes gate electrodes 120 formed apart from each other, a P base region 122 formed on a portion of main surface 141 located between gate electrodes 120, emitter layer 118, and electric charge storage layer 113 formed under P base region 122.

Note that emitter layer 118 is formed at a portion on main surface 141 adjacent to gate electrode 120 on a side facing adjacent gate electrode 120.

Trench-type insulated gate semiconductor device 100 includes dummy gate 121 formed apart from gate electrode 120 on a side opposite to the farther gate electrode 120 with respect to the closer gate electrode 120.

Floating region 112 is formed at a portion of main surface 141 located between gate electrode 120 and dummy gate 121, and at a portion located on a side opposite to gate electrode 120 with respect to dummy gate 121.

Here, a depth D1 of dummy gate 121 in a vertical direction relative to main surface 141 is made larger than a depth D2 of gate electrode 120. By forming dummy gate 121 to be deeper as such, a volume of n⁻ semiconductor base 114 can further be reduced when compared with the case where dummy gate 121 is formed to have a depth approximately the same as a depth of gate electrode 120.

It is thereby possible to reduce an amount of holes stored in n⁻ semiconductor base 114, so that turn-off time can be reduced during switching to OFF.

Further, by making depth D2 of dummy gate 121 to be larger than a depth of gate electrode 120, it is possible to further reduce an influence exerted on gate electrode 120 by fluctuations in potential of the portion of floating region 112 located on a side opposite to gate electrode 120 with respect to dummy gate 121.

Here, in trench-type insulated gate semiconductor device 100 according to the eighth embodiment of the present invention, it is also possible to reduce fluctuations in input capacitance and feedback capacitance by setting width W of P base region 122 located between gate electrodes 120 to be at most 1.4 µm (preferably at most 1.2 µm).

(Ninth Embodiment)

With the use of FIG. 18, trench-type insulated gate semiconductor device 100 according to a ninth embodiment of the present invention will be described. Note that the configurations shown in FIG. 18 that are the same as or correspond to the configurations shown in FIG. 1 to FIG. 17 described above are provided with the same reference characters, and the description thereof may not be repeated.

Figure 18:
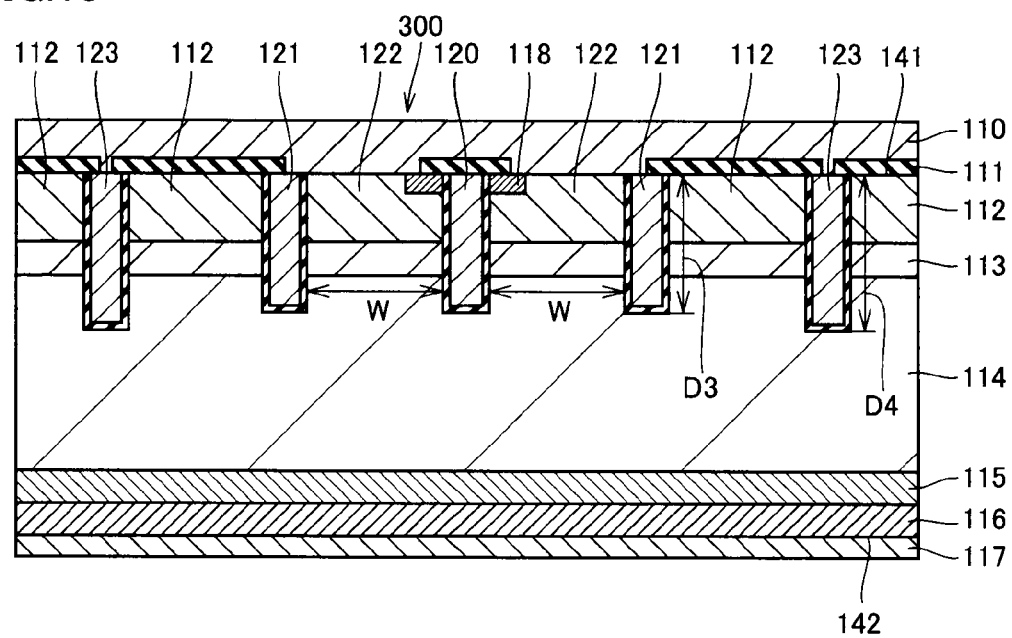
FIG. 18 is a cross-sectional view for describing a trench-type insulated gate semiconductor device according to a ninth embodiment of the present invention.

FIG. 18 is a cross-sectional view of trench-type insulated gate semiconductor device 100 according to the ninth embodiment of the present invention. In the example shown in FIG. 18, cell 300 includes gate electrode 120, dummy gates 121 formed apart from gate electrode 120 on its opposite sides, P base region 122 formed at a portion of main surface 141 located between dummy gate 121 and gate electrode 120, emitter layer 118 formed in P base region 122, and electric charge storage layer 113 formed under P base region 122.

Emitter layer 118 is formed at a portion of main surface 141 adjacent to gate electrode 120 on each of its opposite sides.

Floating region 112 is formed on a portion of main surface 141 located on a side opposite to P base region 122 with respect to dummy gate 121. Here, dummy gate 121 is located between gate electrode 120 and floating region 112, and hence even if a potential of floating region 112 fluctuates, an influence thereof exerted on gate electrode 120 can be reduced.

In particular, dummy gates 121 are formed on the opposite sides of gate electrode 120 such that they surround gate electrode 120, and floating region 112 is formed outside thereof. Therefore, an influence on gate electrode 120 due to fluctuations in potential of floating region 112 is reduced.

Split dummy gate 123 is formed apart from each dummy gate 121 on a side opposite to gate electrode 120 with respect to the relevant dummy gate 121. With this split dummy gate 123, floating region 112 can be segmented, and hence it is possible to further suppress electric field concentration in floating region 112 when compared with the case where floating region 112 having a larger width is formed.

Further, split dummy gate 123 is formed such that a depth D4 of split dummy gate 123 is made larger than a depth D3 of each of dummy gate 121 and gate electrode 120. It is thereby possible to reduce an amount of holes stored in n⁻ semiconductor base 114, and reduce turn-off time during switching to OFF.

Note that in trench-type insulated gate semiconductor device 100 according to the ninth embodiment of the present invention, width W of electric charge storage layer 113 formed between gate electrode 120 and dummy gate 121 is also set to be at most 1.4 µm, and hence input capacitance and feedback capacitance are made stable.

(Tenth Embodiment)

With the use of FIG. 19, trench-type insulated gate semiconductor device 100 according to a tenth embodiment of the present invention will be described. Note that the configurations shown in FIG. 19 that are the same as or correspond to the configurations shown in FIG. 1 to FIG. 18 described above are provided with the same reference characters, and the description thereof may not be repeated.

Figure 19:
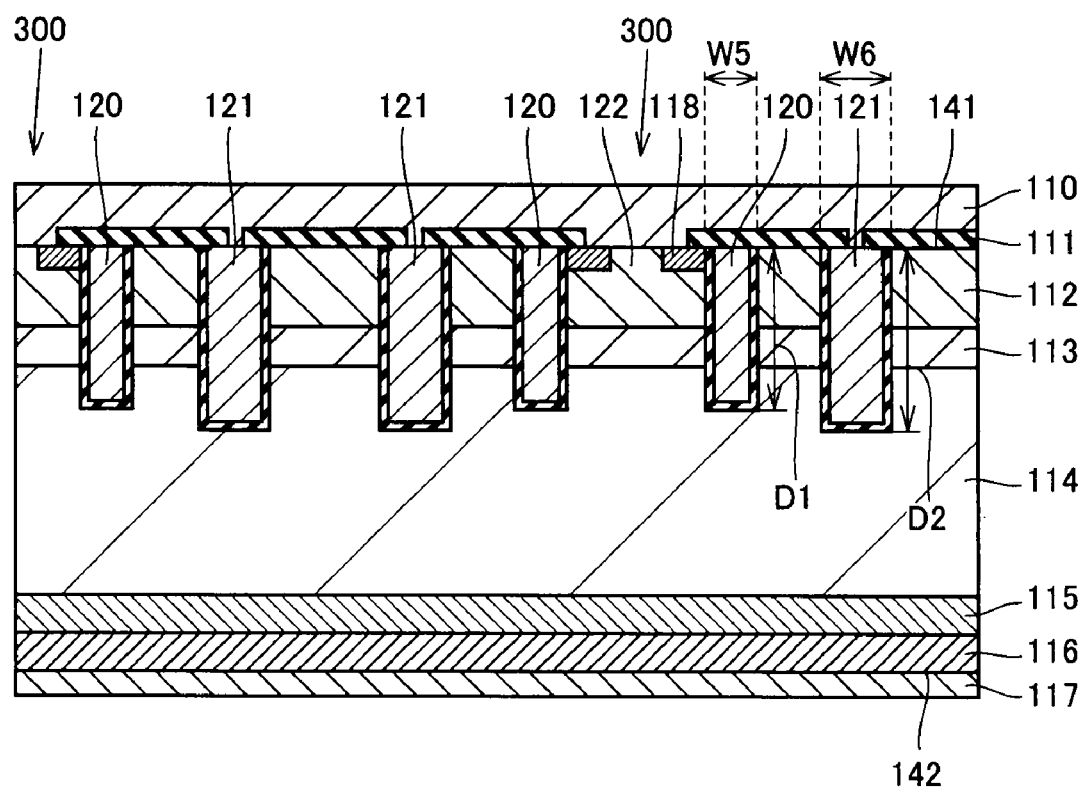
FIG. 19 is a cross-sectional view for describing a trench-type insulated gate semiconductor device according to a tenth embodiment of the present invention.

In FIG. 19, cell 300 includes gate electrodes 120 formed apart from each other, P base region 122 formed on a portion of main surface 141 located between gate electrodes 120, emitter layer 118 formed in P base region 122, and electric charge storage layer 113 formed under P base region 122.

Emitter layer 118 is formed at a portion on main surface 141 adjacent to gate electrode 120 on a side facing opposite gate electrode 120.

Further, trench-type insulated gate semiconductor device 100 includes dummy gate 121 formed apart from gate electrode 120, floating region 112 formed between gate electrode 120 and dummy gate 121, and floating region 112 formed on a side opposite to gate electrode 120 with respect to dummy gate 121.

Here, a width of floating region 112 located between gate electrode 120 and dummy gate 121 is kept small, and hence fluctuations in potential of this floating region 112 are kept small.

Therefore, even if a potential of floating region 112 located between gate electrode 120 and dummy gate 121 fluctuates, it is possible to reduce an influence thereof exerted on a potential of gate electrode 120.

Floating region 112 is formed on a portion of main surface 141 located on a side opposite to cell 300 with respect to dummy gate 121. As such, dummy gate 121 having its potential fixed is provided between gate electrode 120 and floating region 112 located outside with respect to dummy gate 121.

Even if a potential of floating region 112 located outside with respect to dummy gate 121 fluctuates, an influence thereof exerted on gate electrode 120 can thereby be reduced.

Here, dummy gate 121 is formed such that a width W6 of dummy gate 121 in a direction along main surface 141 is larger than a width W5 of gate electrode 120.

Further, dummy gate 121 extends such that it reaches n⁻ semiconductor base 114 from main surface 141, and is formed such that depth D2 of dummy gate 121 is larger than depth D1 of gate electrode 120.

As such, dummy gate 121 formed to have a large width and a large depth reduces a volume of n⁻ semiconductor base 114, so that an amount of holes stored in n⁻ semiconductor base 114 can be reduced. In connection with this, it is possible to reduce time required for ejecting the holes in n⁻ semiconductor base 114 to emitter electrode 110 during switching to OFF.

A trench groove for dummy gate 121 is formed such that it has a depth and a width both larger than a depth and a width of the trench groove for gate electrode 120.

Here, when a trench groove having a larger width and a trench groove having a smaller width are formed by patterning, the trench groove having a larger width generally achieves a larger depth (micro-loading effect). Therefore, in the example shown in FIG. 19, in the step of forming trench grooves for gate electrode 120 and dummy gate 121, it is possible to form the trench groove having a larger width and a larger depth and intended for dummy gate 121, and the trench groove having a smaller width and a smaller depth and intended for gate electrode 120, without requiring an additional step. Note that in a tenth embodiment of the present invention, a plurality of dummy gates 121 are formed apart from one another on a portion of main surface 141 located between adjacent cells 300, and are located between gate electrodes 120 of adjacent cells 300. Dummy gate 121 splits floating region 112 formed between adjacent cells 300 into a plurality of sections, and floating regions 112 are formed between dummy gates 121, and between dummy gate 121 and gate electrode 120.

Note that in the example shown in FIG. 19, by setting a width of electric charge storage layer 113 located between gate electrodes 120 is also set to be at most 1.4 μm, it is possible to reduce fluctuations in input capacitance and feedback capacitance, and suppress generation of electromagnetic noise.

(Eleventh Embodiment)

Figure 20:
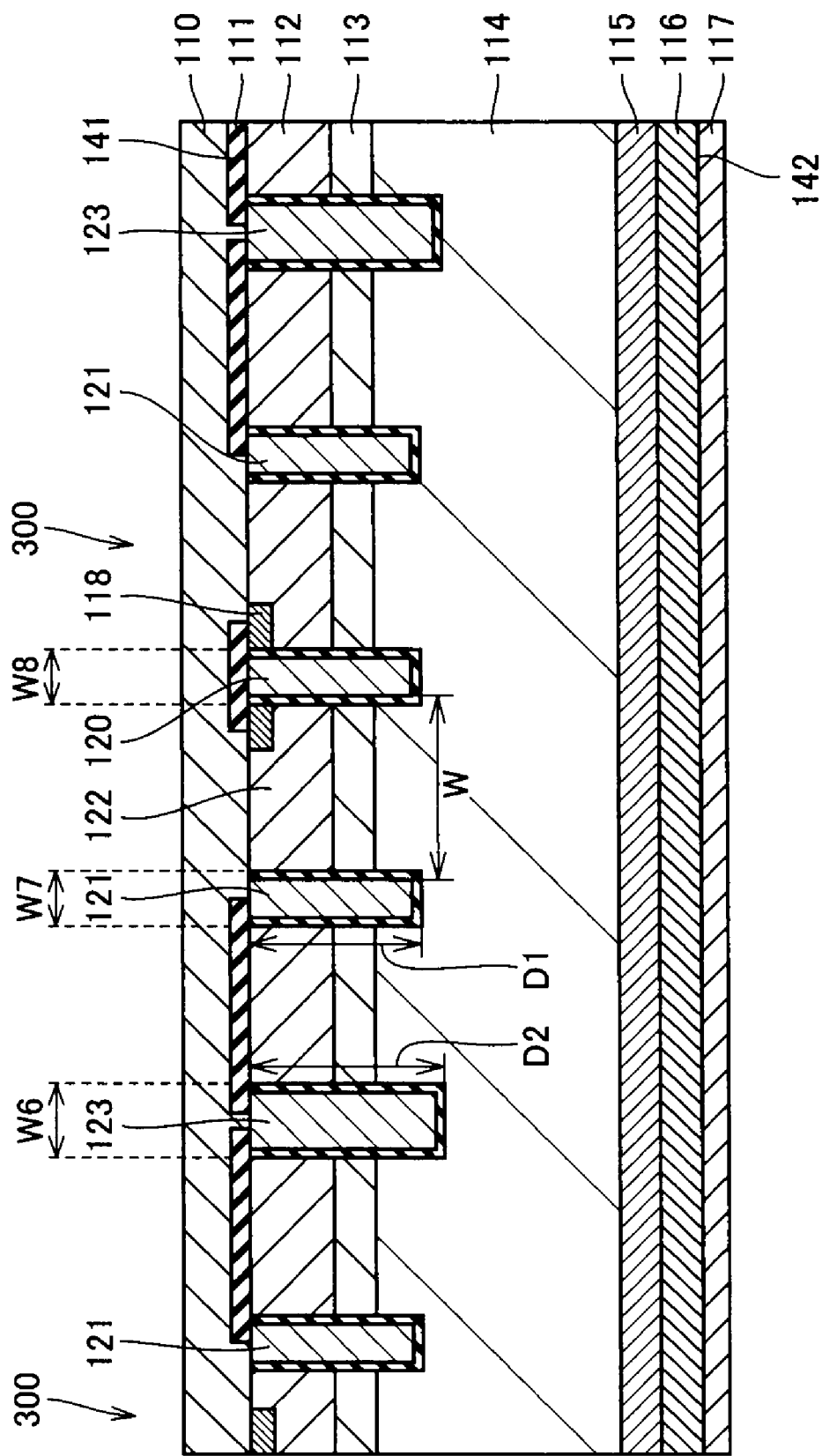
FIG. 20 is a cross-sectional view for describing a trench-type insulated gate semiconductor device according to an eleventh embodiment of the present invention.

With reference to FIG. 20, trench-type insulated gate semiconductor device 100 according to an eleventh embodiment of the present invention will be described. Note that the configurations shown in FIG. 20 that are the same as or correspond to the configurations shown in FIG. 1 to FIG. 19 are provided with the same reference characters, and the description thereof may not be repeated.

FIG. 20 is a cross-sectional view of trench-type insulated gate semiconductor device 100 according to the eleventh embodiment of the present invention.

As shown in FIG. 20, cell 300 includes gate electrode 120, P base region 122 formed at a portion of main surface 141 located on each of opposite sides of gate electrode 120, emitter layer 118 located on P base region 122 on each of the opposite sides of gate electrode 120, electric charge storage layer 113 formed under P base region 122, and dummy gate 121 formed apart from gate electrode 120 on each of the opposite sides of gate electrode 120.

As such, P base region 122 is formed on each of the opposite sides of gate electrode 120, so that a saturation current can be increased.

In addition, dummy gate 121 connected to emitter electrode 110 is provided such that it is located on a side opposite to gate electrode 120 with respect to P base region 122, and outside P base region 122.

Floating region 112 is formed on a portion of main surface 141 located on a side opposite to P base region 122 with respect to dummy gate 121. In trench-type insulated gate semiconductor device 100 according to the eleventh embodiment, dummy gate 121 can also reduce an influence exerted on a potential of gate electrode 120 by fluctuations in potential of floating region 112.

Further, trench-type insulated gate semiconductor device 100 includes split dummy gate 123 that splits floating region 112 into a plurality of sections. By segmenting floating region 112 by split dummy gate 123, floating region 112 can favorably be formed, and it is possible to reduce an adverse effect such as electric field concentration in floating region 112. Note that in the eleventh embodiment of the present invention, dummy gate 121 of another cell 300 is formed on a side opposite to dummy gate 121 with respect to split dummy gate 123, and split dummy gate 123 is formed between adjacent cells 300. Note that a plurality of split dummy gates 123 may be formed between adjacent cells 300 (between dummy gates 121).

Split dummy gate 123 has depth D2 larger than depth D1 of dummy gate 121 (gate electrode 120).

Here, depth D2 of split dummy gate 123 means a distance from main surface 141 to a bottom portion of split dummy gate 123. Further, depths of dummy gate 121 and gate electrode 120 mean a distance from main surface 141 to a bottom portion of dummy gate 121 and a distance from main surface 141 to a bottom portion of gate electrode 120, respectively.

Further, split dummy gate 123 is formed such that width W6 of split dummy gate 123 is larger than a width W7 of dummy gate 121 and a width W8 of gate electrode 120. As such, by forming split dummy gate 123 to have a larger width and a larger depth, a volume of n⁻ semiconductor base 114 can be reduced, and hence an amount of holes stored in n⁻ semiconductor base 114 can be reduced. By reducing an amount of holes stored in n⁻ semiconductor base 114, turn-off time during switching to OFF can be reduced.

Here, in the step of carrying out patterning to form trench grooves on main surface 141 of the semiconductor substrate, a trench groove having a larger groove width achieves a larger depth.

Therefore, when each trench groove is formed, it is possible to form a trench groove for split dummy gate 123 to have a depth and a width both larger than a depth and a width of another trench groove, without using a special step.

Note that in trench-type insulated gate semiconductor device 100 according to the eleventh embodiment of the present invention, a width W of electric charge storage layer 113 located between gate electrode 120 and dummy gate 121 is also set to be at most 1.4 μm (preferably at most 1.2 μm), as in trench-type insulated gate semiconductor device 100 according to the first embodiment described above.

It is thereby possible to suppress fluctuations in output capacitance and feedback capacitance of trench-type insulated gate semiconductor device 100, and suppress an adverse effect such as generation of electromagnetic noise.

(Twelfth Embodiment)

With the use of FIG. 21, trench-type insulated gate semiconductor device 100 according to a twelfth embodiment of the present invention will be described. Note that the configurations shown in FIG. 21 that are the same as or correspond to the configurations shown in FIG. 1 to FIG. 20 described above are provided with the same reference characters, and the description thereof will not be repeated.

Figure 21:
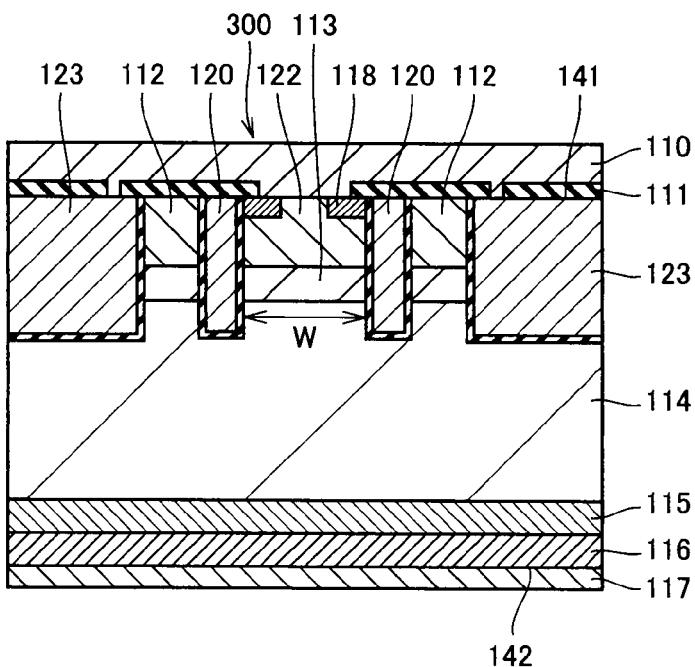
FIG. 21 is a cross-sectional view for describing a trench-type insulated gate semiconductor device according to a twelfth embodiment of the present invention.

As shown in FIG. 21, cell 300 includes gate electrodes 120 formed apart from each other, P base region 122 formed at a portion of main surface 141 located between gate electrodes 120, and emitter layer 118 formed at each portion on P base region 122 adjacent to gate electrodes 120.

Here, split dummy gate 123, and floating region 112 formed on each of opposite sides of split dummy gate 123 are included between adjacent cells 300.

Split dummy gate 123 is formed to have a width larger than a width of floating region 112, and occupies the most part of main surface 141 located between adjacent cells 300.

By forming split dummy gate 123 between adjacent cells 300, it is possible to reduce an influence exerted by fluctuations in potential of gate electrode 120 in one of the cells 300 on a potential of gate electrode 120 in the other of the cells 300.

Here, split dummy gate 123 is formed to have a large width, and to reach n⁻ semiconductor base 114 from main surface 141. Split dummy gate 123 thus reduces a volume of n⁻ semiconductor base 114, and an amount of holes stored in n⁻ semiconductor base 114 is reduced. It is thereby possible to reduce turn-off time of trench-type insulated gate semiconductor device 100 during switching to OFF.

Further, floating region 112 has a width smaller than a width of split dummy gate 123, so that fluctuations in potential of floating region 112 can be kept small, and fluctuations in potential of gate electrode 120 due to fluctuations in potential of floating region 112 can be reduced.

Note that in trench-type insulated gate semiconductor device 100 according to the twelfth embodiment of the present invention, a width of a portion of electric charge storage layer 113 located between gate electrodes 120 is also set to be at most 1.4 µm (preferably at most 1.2 µm), and hence fluctuations in output capacitance and feedback capacitance are reduced.

(Thirteenth Embodiment)

Figure 22:
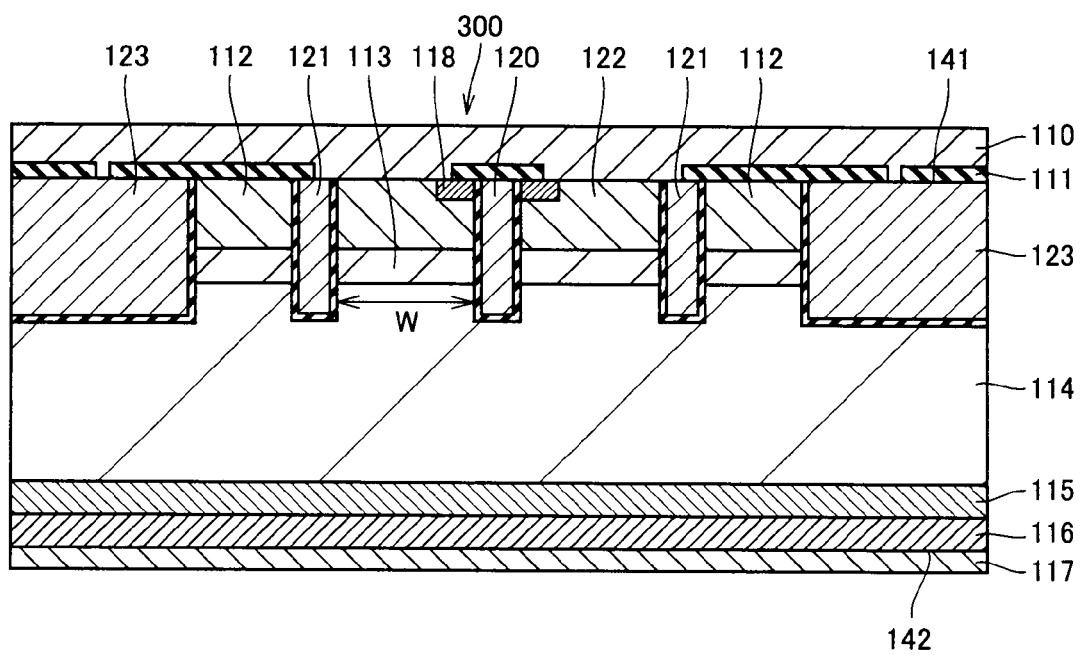
FIG. 22 is a cross-sectional view for describing a trench-type insulated gate semiconductor device according to a thirteenth embodiment of the present invention.

With the use of FIG. 22, trench-type insulated gate semiconductor device 100 according to a thirteenth embodiment of the present invention will be described. Note that the configurations shown in FIG. 22 that are the same as or correspond to the configurations shown in FIG. 1 to FIG. 21 described above are provided with the same reference characters, and the description thereof may not be repeated.

Cell 300 of trench-type insulated gate semiconductor device 100 includes gate electrode 120, P base region 122 formed on each of portions of main surface 141 located on opposite sides of gate electrode 120, emitter layer 118 formed at a portion on P base region 122 and located on each of the opposite sides of gate electrode 120, dummy gate 121 provided on a side opposite to gate electrode 120 with respect to P base region 122, and electric charge storage layer 113 formed under P base region 122.

Split dummy gate 123 having a large width, and floating region 112 formed on each of opposite sides of split dummy gate 123 are formed between adjacent cells 300. As such, split dummy gate 123 is provided between adjacent cells 300, and hence even if a potential of gate electrode 120 in one of the cells 300 fluctuates, it is possible to suppress fluctuations in potential of gate electrode 120 in the other of the cells 300.

Further, dummy gate 121 is provided between gate electrode 120 and floating region 112, so that fluctuations in potential of gate electrode 120 due to fluctuations in potential of floating region 112 can be suppressed.

Split dummy gate 123 has a width larger than a width of floating region 112, and occupies the most part of main surface 141 located between cells 300.

Split dummy gate 123 is formed to reach n⁻ semiconductor base 114 from main surface 141, and hence a volume of n⁻ semiconductor base 114 is reduced. It is thereby possible to reduce an amount of holes stored in n⁻ semiconductor base 114, and reduce turn-off time.

Note that in the semiconductor device according to the thirteenth embodiment of the present invention, width W of a portion of electric charge storage layer 113 located between gate electrode 120 and dummy gate 121 is also set to be at most 1.4 µm (preferably at most 1.2 µm). It is thereby possible to suppress fluctuations in output capacitance and feedback capacitance as in the first embodiment described above, and suppress generation of electromagnetic noise.

(Fourteenth Embodiment)

Figure 23:
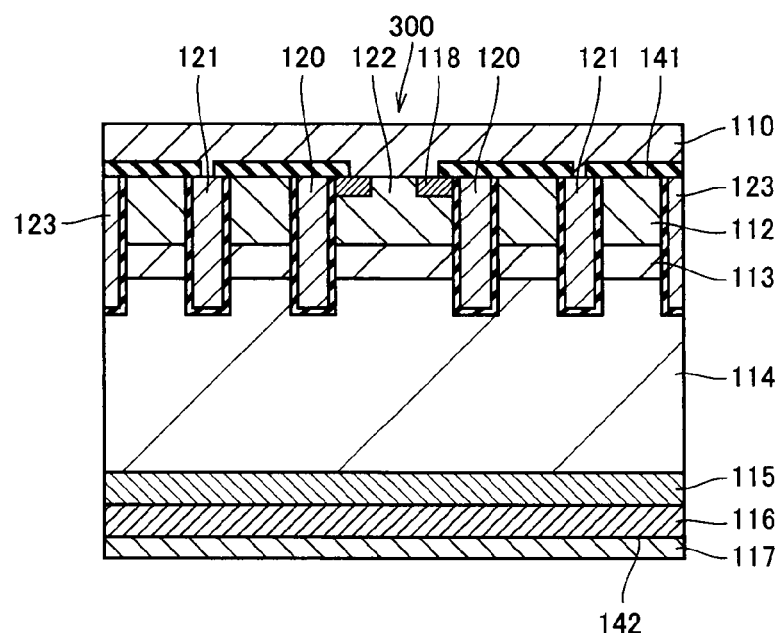
FIG. 23 is a cross-sectional view for describing a trench-type insulated gate semiconductor device according to a fourteenth embodiment of the present invention.

With reference to FIG. 23, trench-type insulated gate semiconductor device 100 according to a fourteenth embodiment of the present invention will be described. Note that the configurations shown in FIG. 23 that are the same as or correspond to the configurations shown in FIG. 1 to FIG. 22 described above are provided with the same reference characters, and the description thereof may not be repeated.

As shown in FIG. 23, cell 300 of trench-type insulated gate semiconductor device 100 includes gate electrodes 120 formed apart from each other, P base region 122 formed at a portion of main surface 141 located between gate electrodes 120, and emitter layer 118 formed at each portion of P base region 122 adjacent to gate electrodes 120.

Further, cell 300 includes electric charge storage layer 113 formed in the semiconductor substrate and formed between gate electrodes 120 and between P base region 122 and n⁻ semiconductor base 114.

Dummy gate 121 is formed on a side opposite to the farther gate electrode 120 with respect to the closer gate electrode 120. A plurality of split dummy gates 123 are formed apart from each other, on a portion of main surface 141 located on a side opposite to gate electrode 120 with respect to dummy gate 121.

Here, floating region 112 is formed on each portion of main surface 141 located between gate electrode 120 and dummy gate 121, between dummy gate 121 and split dummy gate 123, and between split dummy gate 123 and split dummy gate 123.

As such, floating region 112 is formed at a portion of main surface 141 located on a side opposite to P base region 122 with respect to gate electrode 120, and floating region 112 is split into a plurality of sections by dummy gate 121 and split dummy gate 123 provided apart from each other.

Here, a width of the trench groove for gate electrode 120, a width of the trench groove for dummy gate 121, and a width of the trench groove for split dummy gate 123 are approximately the same. Further, these trench grooves are formed to have the same depths.

Here, in the step of forming trench grooves at main surface 141, it is possible to easily perform patterning for forming a plurality of trench grooves that have approximately the same widths and depths at equal spacings, and it is possible to accurately form each of the trench grooves.

By sectioning floating region 112 by dummy gate 121 and split dummy gate 123 formed to have uniform widths and depths as such, it is possible to suppress distortion or the like of the sectioned floating region 112.

It is thereby possible to suppress an adverse effect such as electric field concentration in floating region 112.

Note that in trench-type insulated gate semiconductor device 100 according to the fourteenth embodiment of the present invention, a width of electric charge storage layer 113 located between gate electrode 120 and gate electrode 120 is also set to be at most 1.4 μm (preferably at most 1.2 μm).

It is thereby possible to suppress fluctuations in output capacitance and feedback capacitance of trench-type insulated gate semiconductor device 100, and suppress generation of electromagnetic noise.

(Fifteenth Embodiment)

With the use of FIG. 24, trench-type insulated gate semiconductor device 100 according to a fifteenth embodiment of the present invention will be described.

Figure 24:
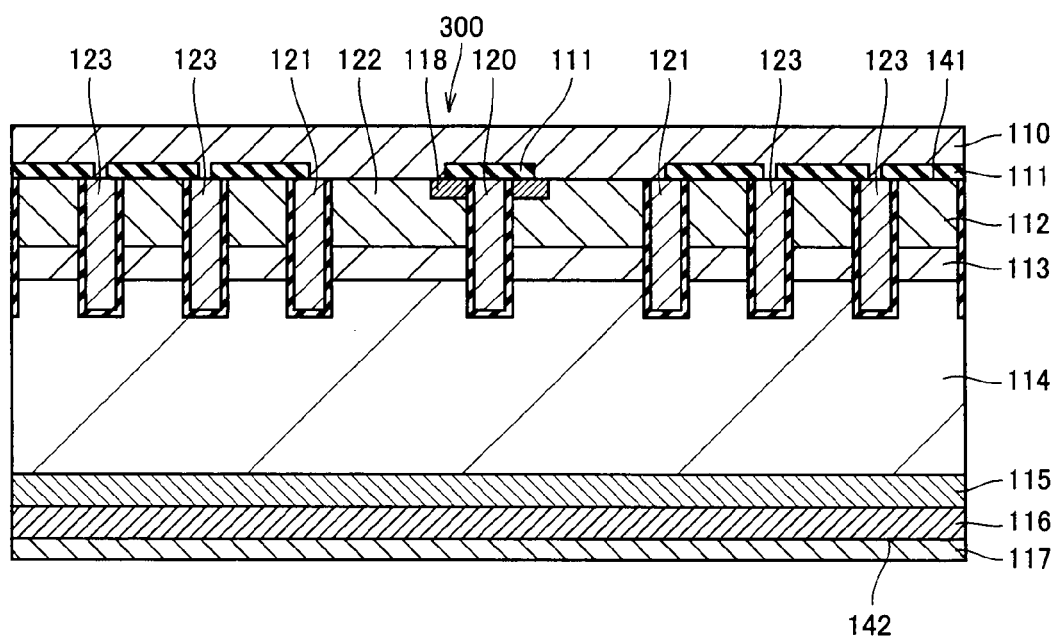
FIG. 24 is a cross-sectional view for describing a trench-type insulated gate semiconductor device according to a fifteenth embodiment of the present invention.

Note that the configurations shown in FIG. 24 that are the same as or correspond to the configurations shown in FIG. 1 to FIG. 23 described above are provided with the same reference characters, and the description thereof may not be repeated.

As shown in FIG. 24, trench-type insulated gate semiconductor device 100 according to the fifteenth embodiment includes gate electrode 120, P base region 122 formed at each of portions of main surface 141 located on opposite sides of gate electrode 120, and emitter layer 118 formed at P base region 122 and formed on each portion adjacent to gate electrode 120.

Further, cell 300 includes dummy gate 121 formed on a side opposite to gate electrode 120 with respect to P base region 122, and electric charge storage layer 113 formed between P base region 122 and n⁻ semiconductor base 114, and formed between dummy gate 121 and gate electrode 120.

A plurality of split dummy gates 123 are provided apart from each other on a side opposite to gate electrode 120 with respect to dummy gate 121.

Floating region 112 is formed at each portion of main surface 141 located between dummy gate 121 and split dummy gate 123, and between split dummy gates 123.

Here, dummy gate 121 is formed between gate electrode 120 and floating region 112, and hence it is possible to suppress fluctuations in potential of gate electrode 120 due to fluctuations in potential of dummy gate 121.

Further, by splitting floating region 112 by the plurality of split dummy gates 123, it is possible to suppress electric field concentration in floating region 112.

Note that in trench-type insulated gate semiconductor device 100 according to the fifteenth embodiment of the present invention, a width of electric charge storage layer 113 located between gate electrode 120 and dummy gate 121 is also set to be at most 1.4 μm (preferably at most 1.2 μm), so that it is possible to reduce input capacitance and feedback capacitance of trench-type insulated gate semiconductor device 100.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
  a semiconductor substrate having first and second main surfaces;
  a first impurity region of a first conductivity type between said first main surface and said second main surface;
  a second impurity region of a second conductivity type at said second main surface;
  a first groove portion at said first main surface and reaching said first impurity region;
  a first electrode in said first groove portion with a first insulating film interposed therebetween;
  a second groove portion apart from said first groove portion and reaching said first impurity region from said first main surface;
  a second electrode in said second groove portion with a second insulating film interposed therebetween;
  a gate wiring connected to said first electrode and capable of applying a gate voltage to the first electrode;
  a third impurity region of said first conductivity typed at a position of said first main surface adjacent to said first electrode on a side facing said second electrode;
  a fourth impurity region of the second conductivity type at said first main surface between said first electrode and said second electrode and surrounding said third impurity region;
  a main electrode on said first main surface and connected to said third impurity region and said fourth impurity region;
  an interlayer insulating film on said first electrode and capable of insulating said main electrode and said first electrode from each other;
  a fifth impurity region of the first conductivity type between said first and second electrodes and between said fourth impurity region and said first impurity region and having an impurity concentration higher than an impurity concentration of said first impurity region; and
  a sixth impurity region of said second conductivity type at said first main surface adjacent to said second electrode on a side opposite to said fourth impurity region with respect to said second electrode, wherein
  said main electrode extends in the direction along which said first and second electrodes are aligned, and is connected to said second electrode, and
  said interlayer insulating film is on said sixth impurity region to insulate said sixth impurity region and said main electrode from each other.

2. The semiconductor device according to claim 1, further comprising a third groove portion in said sixth impurity region and splitting said sixth impurity region, and a third electrode in said third groove portion with a third insulating film interposed therebetween, wherein said third electrode is connected to said main electrode.

3. The semiconductor device according to claim 2, wherein a depth of said third electrode is larger than a depth of said second electrode.

4. The semiconductor device according to claim 2, wherein a width of said third electrode is larger than a width of said second electrode.

5. A semiconductor device, comprising:
  a semiconductor substrate having first and second main surfaces;
  a first impurity region of a first conductivity type between said first main surface and said second main surface;
  a second impurity region of a second conductivity type at said second main surface;
  a first groove portion at said first main surface and reaching said first impurity region;
  a first electrode in said first groove portion with a first insulating film interposed therebetween;
  a second groove portion apart from said first groove portion and reaching said first impurity region from said first main surface;

a second electrode in said second groove portion with a second insulating film interposed therebetween;

a gate wiring connected to said first electrode and capable of applying a gate voltage to the first electrode;

a third impurity region of said first conductivity typed at a position of said first main surface adjacent to said first electrode on a side facing said second electrode;

a fourth impurity region of the second conductivity type at said first main surface located between said first electrode and said second electrode and surrounding said third impurity region;

a main electrode on said first main surface and connected to said third impurity region and said fourth impurity region;

an interlayer insulating film on said first electrode and capable of insulating said main electrode and said first electrode from each other;

a fifth impurity region of the first conductivity type between said first and second electrodes and between said fourth impurity region and said first impurity region, and having an impurity concentration higher than an impurity concentration of said first impurity region and a width in a direction along which said first electrode and said second electrode are aligned of at most 1.4 µm;

a third groove portion apart from said second groove portion;

a third electrode in said third groove portion with a third insulating film interposed therebetween;

a fourth groove portion provided apart from said third groove portion on a side opposite to said second groove portion with respect to said third groove portion; and a fourth electrode in said fourth groove portion with a fourth insulating film interposed therebetween, wherein said second electrode is connected to said gate wiring, and said fourth electrode is connected to said gate wiring, and said third electrode is connected to said main electrode.

6. The semiconductor device according to claim 5, wherein the width of said fifth impurity region is at most 1.2 µm.

7. The semiconductor device according to claim 5, further comprising a sixth impurity region on a main surface of said semiconductor substrate between said second electrode and the third electrode, and on the main surface of said semiconductor substrate between said third electrode and the fourth electrode, and electrically separated from said main electrode by said interlayer insulating film.

8. The semiconductor device according to claim 7, wherein a plurality of said third electrodes are apart from one another, on the main surface of said semiconductor substrate located between said second electrode and said fourth electrode, and said sixth impurity region is on the main surface of said semiconductor substrate located between said third electrodes.

9. The semiconductor device according to claim 8, wherein a spacing between said third electrode and said second electrode is smaller than a spacing between said third electrodes.

10. The semiconductor device according to claim 5, wherein a width of said third electrode is larger than a width of each of said first and second electrodes.

11. The semiconductor device according to claim 5, wherein a depth of said third electrode is larger than a depth of each of said first and second electrodes.

12. The semiconductor device according to claim 1, wherein a width of said fifth impurity region in a direction along which said first electrode and said second electrode are aligned is at most 1.4 µm.

13. The semiconductor device according to claim 12, wherein said width of said fifth impurity region is at most 1.2 µm.

14. A semiconductor device, comprising:
a semiconductor substrate having first and second main surfaces;
a first impurity region of a first conductivity type between said first main surface and said second main surface;
a second impurity region of a second conductivity type at said second main surface;
a first groove portion at said first main surface and reaching said first impurity region;
a first electrode in said first groove portion with a first insulating film interposed therebetween;
a second groove portion in said first main surface, apart from and on a first side of said first groove portion, and reaching said first impurity region;
a second electrode in said second groove portion with a second insulating film interposed therebetween;
a third groove portion in said first main surface, apart from and on a second side of said first groove portion opposite to said first side, and reaching said first impurity region;
a third electrode in said third groove portion with a third insulating film interposed therebetween;
a gate wiring connected to said first electrode and capable of applying a gate voltage to the first electrode;
a third impurity region of said first conductivity type at said first main surface and positioned adjacent to said first electrode;
a fourth impurity region of the second conductivity type at said first main surface between said first electrode and said second electrode and surrounding said third impurity region;
a main electrode on said first main surface and electrically connected to said third impurity region and said second electrode;
an interlayer insulating film on said first electrode and insulating said main electrode and said first electrode from each other; and
a fifth impurity region of the first conductivity type having impurity concentration higher than impurity concentration of said first impurity region, positioned between said first and second electrodes and between said fourth impurity region and said first impurity region, and having a width in a direction along which said first electrode and said second electrode are aligned of at most 1.4 µm.

15. The semiconductor device according to claim 14, wherein said width of said fifth impurity region is at most 1.2 µm.

16. The semiconductor device according to claim 14, further comprising:
a sixth impurity region of said first conductivity type at said first main surface and positioned adjacent to said first electrode on a side of said first electrode opposite to said third impurity region; and
a seventh impurity region of the second conductivity type at said first main surface between said first electrode and said third electrode and surrounding said sixth impurity region,
wherein said main electrode electrically connects said sixth impurity region and said third electrode.

17. The semiconductor device according to claim 16, further comprising a eighth impurity region of the first conductivity type having an impurity concentration higher than an impurity concentration of said first impurity region, said eighth impurity region positioned between said first and third electrodes and between said seventh impurity region and said first impurity region, and having a width in a direction along which said first electrode and said third electrode are aligned of at most 1.4 μm.

18. The semiconductor device according to claim 14, further comprising an electrically floating impurity region of said second conductivity type at said first main surface and adjacent to said second electrode on a side opposite to said fourth impurity region with respect to said second electrode.

19. The semiconductor device according to claim 18, further comprising:
- a fourth groove portion in said first main surface and splitting said electrically floating impurity region; and
- a fourth electrode in said fourth groove portion with a fourth insulating film interposed therebetween, wherein said main electrode is electrically connected to said fourth electrode.

20. The semiconductor device according to claim 19, wherein depth of said fourth electrode is larger than a depth of each of said first and second electrodes.

21. The semiconductor device according to claim 19, wherein a spacing between said fourth electrode and said second electrode is smaller than a spacing between said first and second electrodes.

22. The semiconductor device according to claim 19, wherein a width of said fourth electrode is larger than a width of said second electrode.

23. A semiconductor device, comprising:
- a semiconductor substrate having first and second main surfaces;
- a first impurity region of a first conductivity type between said first main surface and said second main surface;
- a second impurity region of a second conductivity type at said second main surface;
- a first groove portion at said first main surface and reaching said first impurity region;
- a first electrode in said first groove portion with a first insulating film interposed therebetween;
- a second groove portion apart from said first groove portion and reaching said first impurity region from said first main surface;
- a second electrode in said second groove portion with a second insulating film interposed therebetween;
- a gate wiring connected to said first electrode and capable of applying a gate voltage to the first electrode;
- a third impurity region of said first conductivity type at a position of said first main surface adjacent to said first electrode on a side facing said second electrode;
- a fourth impurity region of the second conductivity type at said first main surface located between said first electrode and said second electrode and said third impurity region;
- a main electrode on said first main surface and connected to said third impurity region and said fourth impurity region;
- an interlayer insulating film on said first electrode and capable of insulating said main electrode and said first electrode from each other;
- a fifth impurity region of the first conductivity type between said first and second electrodes and between said fourth impurity region and said first impurity region, and having an impurity concentration higher than an impurity concentration of said first impurity region and a width in a direction along which said first electrode and said second electrode are aligned of at most 1.4 μm;
- a third groove portion apart from said second groove portion;
- a third electrode in said third groove portion with a third insulating film interposed therebetween;
- a fourth groove portion provided apart from said third groove portion on a side opposite to said second groove portion with respect to said third groove portion; and
- a fourth electrode in said fourth groove portion with a fourth insulating film interposed therebetween, wherein said second electrode is connected to said gate wiring, and said fourth electrode and said third electrode are connected to said main electrode.

24. The semiconductor device according to claim 23, further comprising a sixth impurity region on a main surface of said semiconductor substrate between said second electrode and the third electrode, and on the main surface of said semiconductor substrate between said third electrode and the fourth electrode, and electrically separated from said main electrode by said interlayer insulating film.

25. The semiconductor device according to claim 24, wherein
a plurality of said third electrodes are apart from one another, on the main surface of said semiconductor substrate located between said second electrode and said fourth electrode, and said sixth impurity region is on the main surface of said semiconductor substrate located between said third electrodes.

26. The semiconductor device according to claim 25, wherein a spacing between said third electrode and said second electrode is smaller than a spacing between said third electrodes.

27. The semiconductor device according to claim 23, wherein a width of said third electrode is larger than a width of each of said first and second electrodes.

28. The semiconductor device according to claim 23, wherein a depth of said third electrode is larger than a depth of each of said first and second electrodes.

29. The semiconductor device according to claim 23, wherein the width of said fifth impurity region is at most 1.2 μm.

* * * * *